United States Patent
Eom et al.

(10) Patent No.: US 10,580,872 B2
(45) Date of Patent: Mar. 3, 2020

(54) OXIDE HETEROSTRUCTURES HAVING SPATIALLY SEPARATED ELECTRON-HOLE BILAYERS

(71) Applicant: Wisconsin Alumni Research Foundation, Madison, WI (US)

(72) Inventors: Chang-Beom Eom, Madison, WI (US); Hyungwoo Lee, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/596,505

(22) Filed: May 16, 2017

(65) Prior Publication Data
US 2018/0337238 A1  Nov. 22, 2018

(51) Int. Cl.
H01L 29/24 (2006.01)
H01L 29/778 (2006.01)
H01L 29/66 (2006.01)

(52) U.S. Cl.
CPC ........ H01L 29/24 (2013.01); H01L 29/66969 (2013.01); H01L 29/778 (2013.01); H01L 29/7781 (2013.01)

(58) Field of Classification Search
CPC ....... H01L 29/778; H01L 29/24; H01L 29/66; H01L 29/77; H01L 29/66969; H01L 29/7781
See application file for complete search history.

(56) References Cited

U.S. PATENT DOCUMENTS

| | | | |
|---|---|---|---|
| 2010/0051079 A1* | 3/2010 | Majumdar | H01L 35/22 136/201 |
| 2011/0065237 A1* | 3/2011 | Bennahmias | C23C 16/0263 438/104 |
| 2011/0248360 A1* | 10/2011 | Luo | H01L 29/513 257/411 |
| 2013/0048950 A1* | 2/2013 | Levy | B82Y 10/00 257/29 |

(Continued)

FOREIGN PATENT DOCUMENTS

WO    WO 2012/013943    2/2012

OTHER PUBLICATIONS

Huijben M. et al. Local probing of coupled interfaces between two-dimensional electron and hole gases in oxide heterostructures by variable-temperature scanning tunneling spectroscopy, Physical Review B, 035140, Jul. 24, 2012, pp. 035140-1 to 035140-5.*

(Continued)

*Primary Examiner* — Fazli Erdem
(74) *Attorney, Agent, or Firm* — Bell & Manninng, LLC; Michelle Manning

(57) ABSTRACT

Oxide heterostructures that form spatially separated electron-hole bilayers are provided. Also provided are electronic devices that incorporate the oxide heterostructures. The oxide heterostructure includes a base layer of $SrTiO_3$, a polar layer of $LaAlO_2$, and a non-polar layer of $SrTiO_3$. Within the oxide heterostructures, a two-dimensional hole gas (2DHG) is formed at the interface between the non-polar layer and the polar layer and a two-dimensional electron gas (2DEG) is formed at the interface between the polar layer and the base layer.

11 Claims, 32 Drawing Sheets

(56) References Cited

U.S. PATENT DOCUMENTS

| | | | | |
|---|---|---|---|---|
| 2013/0285048 A1* | 10/2013 | Tsu | ........................ | H01L 29/24 257/43 |
| 2014/0253183 A1* | 9/2014 | Holmes | .................. | H01L 29/24 327/109 |
| 2016/0020382 A1* | 1/2016 | Levy | .................. | G11C 11/1675 335/284 |

OTHER PUBLICATIONS

Kalabukhov et al. Effect of oxygen vacancies in the SrTiO3 substrate on the electrical properties of the LaAlO3 /SrTiO3 interface; Physical Review B 75, 121404, Mar. 19, 2007, pp: 121404-01 to 121404-4.*

Yuan et al. "Positron annihilation studies on the behaviour of vacancies in LaAlO3/SrTiO3 heterostructures"; J. Phys. D: Appl. Phys. 45 (2012) 445305 (5pp).*

Janotti, A., et al., Controlling the density of the two-dimensional electron gas at the SrTiO3/LaAlO3 interface, Physical Review B 86, 241108(R), Dec. 26, 2012, pp. 241108-1 to 241108-5.

Park, Min Sik, et al., Charge compensation and mixed valency in LaAlO3/SrTiO3 heterointerfaces studied by the Flapw method, Physical Review B 74, 205416, Nov. 14, 2006, pp. 205415-1 to 205416-6.

Pentcheva, R., et al., Charge localization or itineracy at LaAlO3/SrTiO3 interfaces: Hole polarons, oxygen vacancies, and mobile electrons, Physical Review B 74, 035112, Jul. 18, 2006, pp. 035112-1 to 035112-7.

Pentcheva, R., et al., Parallel electron-hole bilayer conductivity from electronic interface reconstruction, Phys. Rev. Lett. 104:16, Apr. 23, 2010, pp. 166804-166807.

Basletic, M., et al., Mapping the Spatial Distrubition of Charge Carriers in LaAlO3/SrTiO3 Heterostructures, Nature Materials 7, Jun. 29, 2008, pp. 621-625.

Cancellieri, C., et al., Polaronic metal state at the LaAlO3/SrTiO3 interface, Nature Communications 7:10386, Jan. 27, 2016, pp. 1-7.

Eisenstein, J.P., et al., Bose-Einstein Condensation of Excitons in Bilayer Electron Systems, Nature 432, Dec. 9, 2004, pp. 691-694.

Herranz, et al., High Mobility in LaAlO3/SrTiO3 Heterostructures: Origin, Dimensionality and Perspectives, Phys. Rev. Lett. 98, 21, May 21, 2007, pp. 216803-216806.

Lee, P.W., et al., Hidden lattice instabilities as origin of the conductive interface between insulating LaAlO3 and SrTiO3, Nature Communications 7:12773, Sep. 14, 2016, pp. 1-8.

Millis, A.J., et al., Electron-Hole Liquids in Transition-Metal Oxide Heterostructures, Phys. Rev. B 82:7, Aug. 3, 2010, pp. 073101-073104.

Nakagawa, Naoyuki, et al., VVhy Some Interfaces Cannot be Sharp, Nature Materials 5, Jan. 22, 2006, pp. 204-209.

Rubano, A., et al., Influence of atomic termination on the LaAlO3/SrTiO3 interfacial polar rearrangement, Phys. Rev. B 88, 035405, Jul. 2, 2013, pp. 1-5.

Zhong, Zhicheng, Polarity-induced oxygen vacancies at LaAlO3jSrTiO3 interfaces, Phys. Rev. B 82, 16, Oct. 28, 2010, pp. 165127-165131.

Ohtomo, A., et al., A high-mobility electron gas at the LaAlO3/SrTiO3 heterointerface, Nature 427, Jan. 29, 2004, pp. 423-426.

Zhong et al., Polarity-induced oxygen vacancies at LaAlO3 ÔSrTiO3 interfaces, Physical Review B 82, 165127, Oct. 28, 2010.

Li et al., Formation of oxygen vacancies and charge carriers induced in the n-type interface of a LaAlO3 overlayer on SrTiO3(001), Physical Review B 84, 245307, Dec. 12, 2011.

Nakagawa et al., Why some interfaces cannot be sharp, Nature Materials, vol. 5, Mar. 2006.

* cited by examiner

FIG. 6A
FIG. 6B
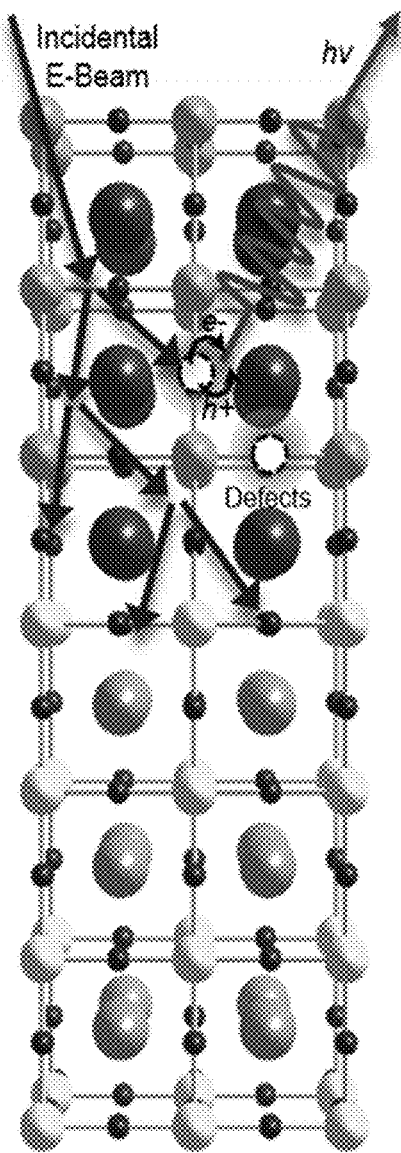
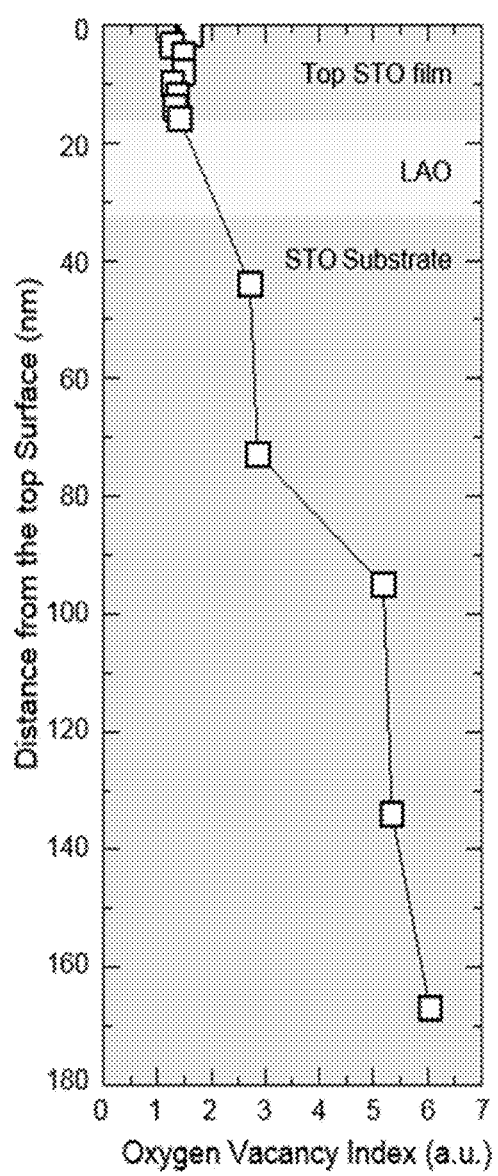

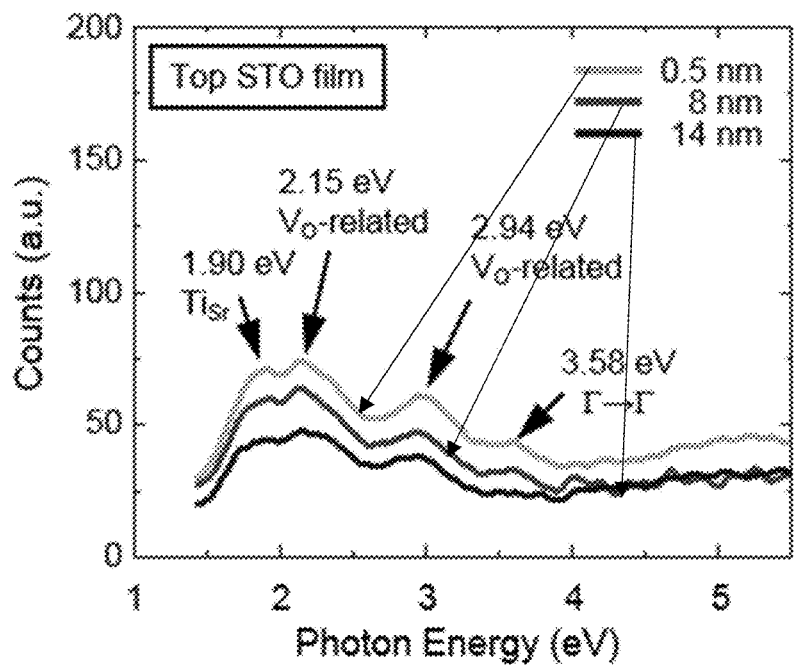
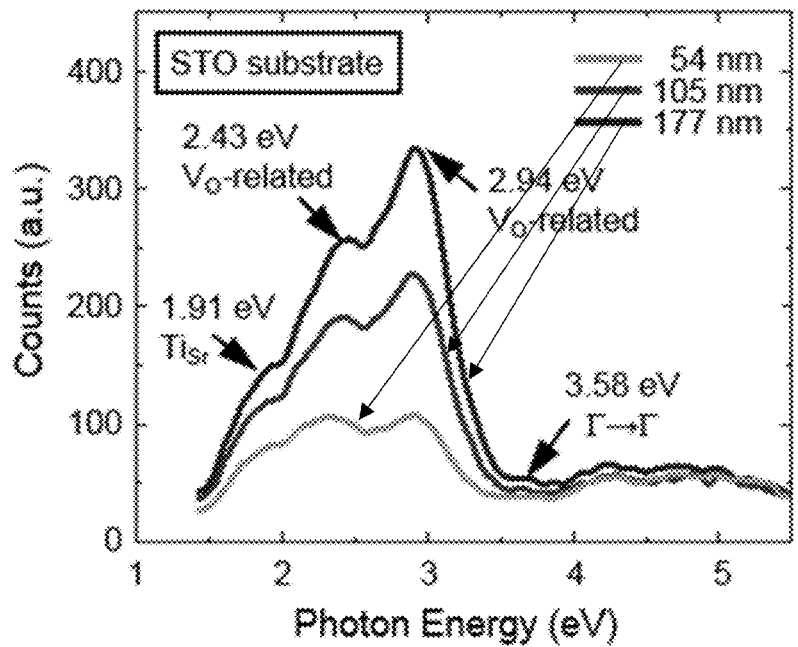

OXIDE HETEROSTRUCTURES HAVING SPATIALLY SEPARATED ELECTRON-HOLE BILAYERS

REFERENCE TO GOVERNMENT RIGHTS

This invention was made with government support under DE-FG02-06ER46327 awarded by the US Department of Energy and under FA9550-15-1-0034 awarded by the USAF/AFOSR. The government has certain rights in the invention.

BACKGROUND

The study of electrons and holes at semiconductor interfaces has led to many interesting discoveries, particularly when both can be used as a comparison, or interact with each other as excitonic and Coulomb drag excitations. A two-dimensional electron gas (2 DEG) at an oxide heterointerface, however, is confined electronically at atomic length scales. Its properties arise from orbital-selective quantum confinement. The confinement of the 2DEG arises primarily from the self-consistent electric potential, rather than a physical quantum well thickness. As a result, its strong spatial gradients enhance its electronic correlations.

Since two-dimensional (2D) conduction at a polar/non-polar oxide heterointerface was first observed, substantial effort has been devoted to understanding the underlying physics and microscopic origin of interface conductivity. One interesting but still challenging issue is the realization of electron-hole bilayers using the 2D-confined charge carriers in oxide heterostructures.

The emergence of the 2D-confined electrons in oxide heterointerfaces is often understood within the "polar catastrophe" model. (See, Nakagawa, N., Why some interfaces cannot be sharp. *Nat Mater* 5, 204-209 (2006).) Applied to an interfacial electron liquid oxide heterostructure, due to the polar discontinuity at the polar/non-polar interface, an electric field in the overlying polar layer points away from the interface to the top surface. The resulting electrostatic potential diverges as the thickness of the heterostructure grows. To avoid such potential divergence, negative charge carriers accumulate at the interface, creating a so-called n-type interface. Similarly, a p-type interface can be envisaged at the interface between an oppositely oriented polar material and a non-polar material. Even though theoretical studies have predicted 2D-confined hole carriers at such interfaces, most of the experimentally-tested p-type interfaces have exhibited insulating behavior.

SUMMARY

Oxide heterostructures that form spatially separated electron-hole bilayers are provided. Also provided are electronic devices, such as transistors, that incorporate the oxide heterostructures.

One embodiment of an oxide heterostructure includes: a base layer comprising $SrTiO_3$; a polar layer comprising $LaAlO_3$, on the base layer; a non-polar layer comprising $SrTiO_3$ on the polar layer; a two-dimensional electron gas confined at an interface between the base layer and the polar layer; and a two-dimensional hole gas confined at an interface between the polar layer and the non-polar layer.

One embodiment of a transistor includes: an oxide heterostructure of the type described herein; a source electrode; a drain electrode, wherein the source electrode and the drain electrode are in electrical communication through either the 2DEG or the 2DHG; and a gate electrode that is configured to alter the current flowing between the source electrode and the gate electrode when a gate voltage is applied to the gate electrode. The transistor can be, for example, a p-channel transistor, an n-channel transistor, or a bidirectional transistor.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 3A shows the electronic reconstruction across the whole heterostructure. The polar catastrophe mechanism suggests that the non-zero electric field coming from the polarity discontinuity at the heterointerfaces needs to be compensated to avoid potential divergence. At the bottom interface of $(LaO)^+/(TiO_2)^0$, the polar instability is resolved by 2D-confined electrons. At the top interface of $(SrO)^0/(AlO_2)^-$, hole carriers can resolve the polar instability. FIG. 3B shows STEM-ADF images obtained at the top interface. The inset shows the filtered image with a higher magnification. The atomic configuration is notified by schematics. FIG. 3C shows EDS elemental mapping of the same sample. The interface is atomically abrupt, and intermixing is not significant. FIG. 3D shows a COBRA-derived cation electron density map across the top STO/LAO interface. The interface is atomically abrupt and consists of SrO and $AlO_2$ layers as designed.

FIG. 4A is a schematic depicting the separate contacts for the top and the bottom interface. FIG. 4B shows Hall resistance $R_{xy}$ versus magnetic field μ0H the top and the bottom interface at 4 K. The top interface clearly shows a positive slope indicating the p-type conductivity, while the bottom interface shows a negative slope indicating the n-type conductivity of 2DEG. FIG. 4C shows the temperature dependency of sheet resistance $R_{xx}$ (T) for the top (squares) and the bottom (circles) interfaces. FIG. 4D shows the temperature dependency of sheet carrier density $n_{sheet}$ (T) for the interfaces. FIG. 4E shows the temperature dependency of mobility $μ_H$ (T) for the interfaces. The inset shows the mobility graph with a linear scale at low temperature.

FIG. 5A is a charge distribution map of the STO (4 nm)/LAO (16 nm)/STO sample obtained by the in-line electron holography technique. The top and the bottom interfaces clearly show the positive and the negative charges, respectively. FIG. 5B shows the charge density profile across the top and bottom interfaces. The line profile is obtained by averaging the charge density map over 200 nm in lateral dimension.

FIGS. 6A-6D depict the oxygen vacancy distribution in the STO/LAO/STO heterostructure. FIG. 6A is a schematic depicting the mechanism of DR-CLS. By optically detecting the luminescence signals, the band-to-defect transitions can be detected as well as a band-to-band transition. FIG. 6B shows a profile of the oxygen vacancy index across the interfaces. FIG. 6C shows the representative CLS data in the top STO film. FIG. 6D shows the representative CLS data in the bulk STO substrate.

FIG. 7A shows the atomic structure of the STO/LAO/STO heterostructure. Three cases are considered: a defect-free structure with no oxygen vacancies and two defect structures with oxygen vacancy placed either at the top STO/LAO interface or at the top of the LAO layer. The position of oxygen vacancy is indicated in the scheme. FIG. 7B shows the layer-resolved DOS of the defect-free structure. The polar interfaces create an electric field in LAO which places the Fermi energy (denoted by the dashed vertical line) in the conduction band of STO at the bottom interface, resulting in the 2DEG, and in the valence band of STO at the top interface, resulting in the 2DHG. FIG. 7C shows the layer-resolved DOS of the defect structure with oxygen vacancy at the top STO/LAO interface and at the top of the LAO layer. The electric field in LAO is quenched, and the Fermi energy is pinned by the oxygen vacancy defect state, which eliminates the 2DHG at the top interface.

FIG. 8A shows the thickness-dependent evolution of in-situ RHEED intensity oscillation during the PLD deposition of the STO and LAO films. FIG. 8B shows atomic force microscopy (AFM) images measured on the surface of STO(001) substrate, LAO (40 unit-cells) film and STO (10 unit-cells) film, respectively. The insets in AFM images represent the RHEED patterns at each step of the PLD growths. FIG. 8C shows the out-of-plane θ-2θ X-ray diffraction pattern around (002) STO peak. FIG. 8D depicts reciprocal space mapping of the heterostructure. The STO and the LAO thin films are fully coherent with the (001) STO substrate.

FIG. 9A shows CTR data and COBRA fits obtained from the STO(10 unit-cells)/LAO (40 unit-cells)/STO sample. The fitting result exhibited the R-factor of 5.1%. FIG. 9B shows COBRA-derived 2D electron density maps of the STO/LAO/STO heterostructure sliced through the (110) plane. FIG. 9C shows COBRA-derived 2D electron density maps of the STO/LAO/STO heterostructure sliced through the (200) plane. FIG. 9D shows an electron density profile across the top and the bottom interfaces. The top p-type interface is atomically-abrupt, while the bottom n-type interface is slightly intermixed in the range of ~3 unit-cells. The density profile fall-off at the top surface is mainly due to incomplete layer coverage. FIG. 9E shows a cation elemental profile of the same structure. The elemental profile represents the integrated electron number for each cation column along the out-of-plane direction (001). All the estimated electron numbers are consistent with the expected atomic number of Sr (38), La (57), Ti (22), and Al (13). The intermediate values near the n-type interface indicate the atomic intermixing. FIG. 9F shows the lattice spacing of each layers. The lattice spacing in the top STO layer is nearly identical with that in the STO substrate, indicating that the top STO thin film has a perfect lattice structure without significant oxygen vacancy defects. The lattice spacing between the 49th and the 50th layer is excluded from the graph because the topmost lattice spacing value is not reliable due to the incomplete layer coverage.

FIGS. 10A-10D show the fabrication process for the separate contacts to the top and the bottom interface. Using a photolithography method and ion-milling, the top STO thin film is square-patterned first. To minimize the formation of additional oxygen vacancy or other defects, the ion-milling process was performed with a very gentle condition (See Methods). The 4 corners of the patterned-STO are then covered by Pt (90 nm)/Al (20 nm) pads. A conventional wire-bonding was performed on the metal pads for the top interface contact, and on the bare LAO surface for the bottom interface contact. FIG. 10E is an optical image of the patterned-STO and metal pads on it. FIG. 10F shows I-V characteristics of the top and the bottom interfaces at room temperature. Both channels are showing Ohmic contacts. FIG. 10G shows the Hall resistance $R_{xy}$ (H) measured by the metal contacts at room temperature. Note that the metal contacts fabricated by this method show a reliable performance with a low noise.

FIG. 11A shows schematic and STEM images of the STO/LAO/STO heterostructure. Circles represent the depth positions at which the EELS were measured. FIG. 11B shows the depth of the position-dependent Ti-$L_{2,3}$ edge spectra. FIG. 11C shows the depth of the position-dependent O-K edge spectra. FIG. 11D shows the representative Ti-$L_{2,3}$ edge fine structure taken from the bulk STO substrate and the top STO film. FIG. 11E shows the representative O-K edge fine structure at the same positions. Note that the EELS data are nearly the same at the both positions. This result shows that the oxygen deficiency in the top STO film is not greater than that in the STO bulk substrate. However, since the sensitivity of EELS is not sufficient to detect a small amount of point defect, we can only deduce that the oxygen deficiency of the top STO film is not severe enough to change the EELS fine structure. Thus, in the following, the DR-CLS technique was utilized to investigate the oxygen vacancy distribution in more detail.

FIG. 12A shows the CLS spectra from the top STO film. Note that the oxygen vacancy-related signal intensity, relative to the direct transition, from the top STO is much lower than that from the bulk STO substrate, which means the density of oxygen vacancy in the top STO film is extremely low. FIG. 12B shows the CLS spectra from the bulk STO substrate. The relative intensity of oxygen vacancy-related peaks is clearly stronger than those of the top STO film. The spectra features include the oxygen vacancy-related peaks and very small peaks related to anti-site Ti. FIG. 12C shows the effective probing depth of the electron beam as a function of incidental beam energy. These depth positions are calculated by Monte Carlo simulation. According to this result, each spectrum could be assigned to a specific depth position.

DETAILED DESCRIPTION

Oxide heterostructures that form spatially separated electron-hole bilayers are provided. Also provided are electronic devices that incorporate the oxide heterostructures.

Figure 1:
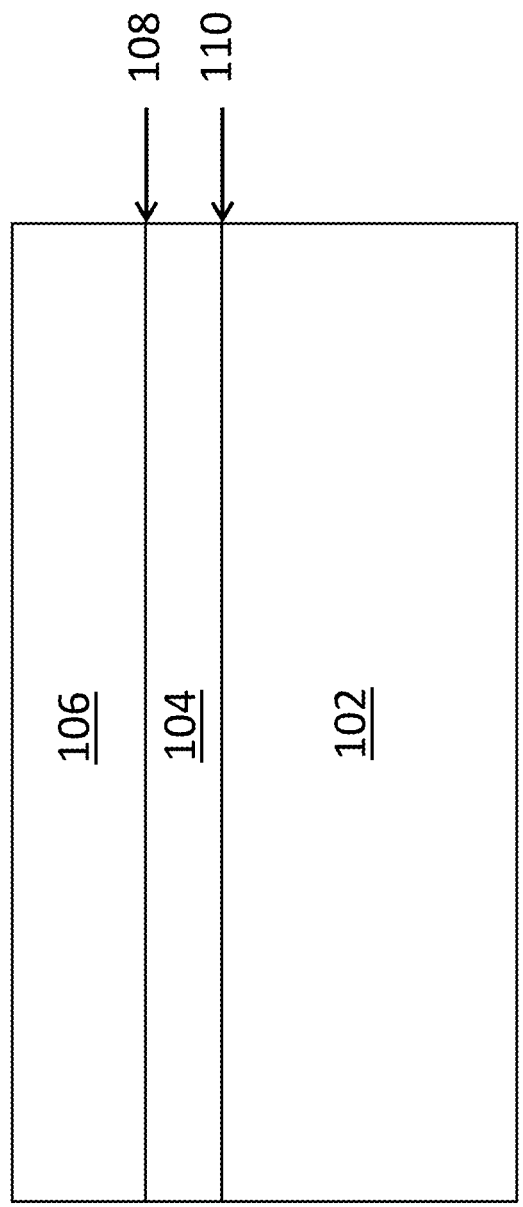
FIG. 1 is a schematic diagram showing a cross-sectional view of an oxide heterostructure that gives rise to a 2DEG and a 2DHG.

An embodiment of an oxide heterostructure is shown schematically in FIG. 1. The oxide heterostructure includes a base layer of $SrTiO_3$ 102, a polar layer of $LaAlO_3$ 104 that forms an interface with the base layer, and a non-polar layer of $SrTiO_3$ 106 that forms an interface with the polar layer. Within the oxide heterostructures, a two-dimensional hole gas (2DHG) 108 is formed at the interface between non-polar layer 106 and polar layer 104 and a two-dimensional electron gas (2DEG) 110 is formed at the interface between polar layer 104 and base layer 102. The interfaces that give rise to the 2DHG and 2DEG are high-quality, sharp, atomically well-defined heterojunctions having low oxygen vacancy concentrations. The respective charge carriers in the 2DHG and 2DEG are highly mobile and well-confined to their respective interfaces.

Figure 2:
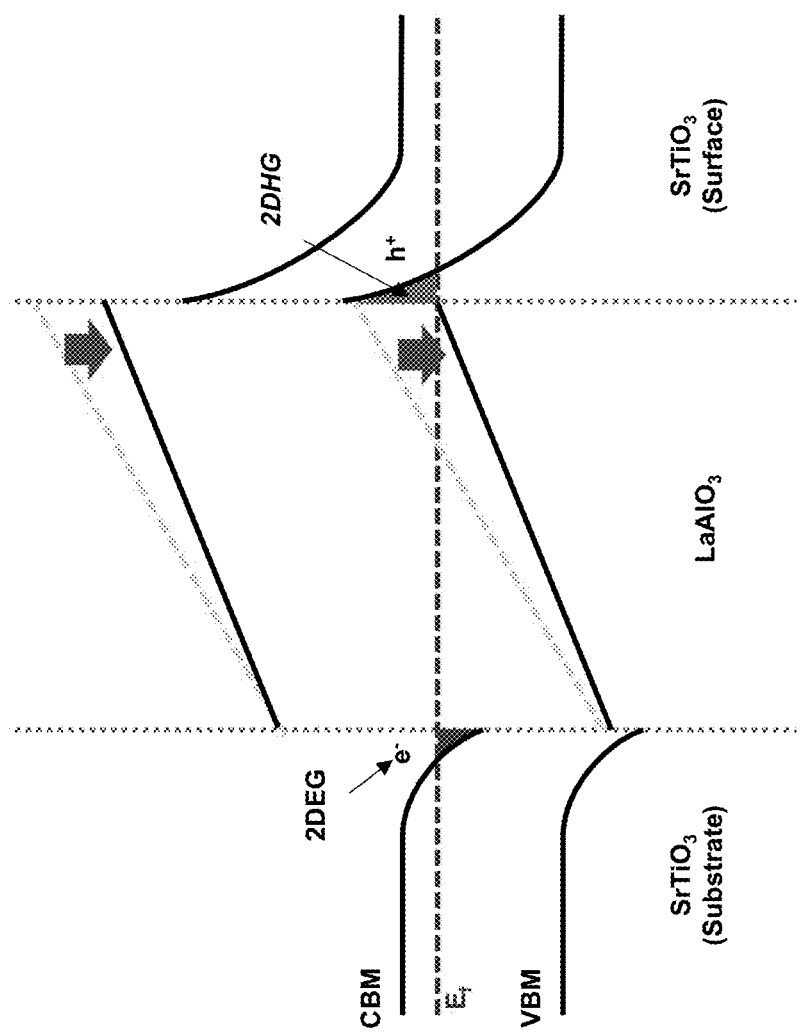
FIG. 2 shows an energy band structure diagram for a heterostructure that gives rise to a 2DEG and a 2DHG.

The 2DHG is a thin layer of highly mobile, highly concentrated holes at the heterojunction between the non-polar $SrTiO_3$ layer and the polar $LaAlO_3$ layer. Similarly, the 2DEG is a thin layer of highly mobile, highly concentrated electrons at the heterojunction between the polar $LaAlO_3$ layer and the base layer of $SrTiO_3$. The formation of the 2DEG and 2DHG can be explained in reference to the band-bending due to the potential build-up in the $LaAlO_3$ layer and the resultant charge compensation shown in the energy band diagram for the heterostructure in FIG. 2. This diagram shows the formation of quantum wells in the band structure, in which holes become confined in the valence band to form a 2DHG and electrons become confined in the conduction band to form a 2DEG. One identifying characteristic of a 2DHG is a positive slope in the graph of the Hall resistance versus magnetic field for the interface forming the 2DHG, as described in the Example. Similarly, one identifying characteristic for a 2DEG is a negative slope in the graph of the Hall resistance versus magnetic field for the interface forming the 2DEG.

The polar $LaAlO_3$ layer has a thickness of at least 4 unit cells, but may have a much greater thickness. For example, the $LaAlO_3$ layer may have a thickness of at least 5 until cells, at least 10 unit cells, at least 20 unit cells, or at least 30 unit cells. For example, the $LaAlO_3$ layer may have a thickness in the range from 4 unit cells to 100 unit cells, although higher thicknesses can also be used.

The heterostructure and, in particular, the $SrTiO_3$ of the non-polar layer desirably has a very low concentration of oxygen vacancies. In some embodiments of the heterostructures, the $SrTiO_3$ of the non-polar layer has an oxygen vacancy concentration that is even lower than that of the $SrTiO_3$ of the base layer, which will generally correspond to a bulk $SrTiO_3$ oxygen vacancy concentration. For the purposes of this disclosure, oxygen vacancy concentration is defined as the oxygen vacancy index, which is the intensity ratio between the peak at 2.9 eV and the peak at 3.6 eV in a cathodoluminescence spectroscopy (DR-CLS) spectrum of the material. The measurement of oxygen vacancy concentrations based on CLS data is illustrated in the Example. By way of illustration, the $SrTiO_3$ of the non-polar layer can have an oxygen vacancy index of 2.5 a.u. or lower, including embodiments of the polar layer in which the $SrTiO_3$ has an oxygen vacancy index of 2 a.u. or lower. Low oxygen vacancy concentrations can be achieved by using a high oxygen partial pressure during the epitaxial growth of the heterostructure and, particularly, during the growth of the $SrTiO_3$ of the non-polar layer. For example, oxygen partial pressures of at least $1\times10^{-3}$ mbar or at least $1\times10^{-2}$ mbar can be used.

Embodiments of the heterostructures can be characterized by the high electron and hole mobilities of their 2DEG and 2DHG, respectively. The mobilities of the charge carriers can be characterized by their Hall mobilities (pH), which can be measured as described in the Example. By way of illustration, in some embodiments of the oxide heterostructures the holes of the 2DHG have a Hall mobility at 20 K of at least $4\times10^2$ $cm^2V^{-1}s^{-1}$. This includes embodiments of the oxide heterostructures in which the holes of the 2DHG have a Hall mobility at a temperature in the range from 1 K to 10 K of at least $5\times10^2$ $cm^2C^{-1}s^{-1}$, further includes embodiments of the oxide heterostructures in which the holes of the 2DHG have a Hall mobility at a temperature in the range from 1 K to 10 K of at least $6\times10^2$ $cm^2C^{-1}s^{-1}$, and still further includes embodiments of the oxide heterostructures in which the holes of the 2DHG have a Hall mobility at a temperature in the range from 1 K to 10 K of at least $8\times10^2$ $cm^2V^{-1}s^{-1}$. Notably, in some embodiments of the oxide heterostructures the electrons of the 2DHG have a Hall mobility at 20 K of at least $4\times10^2$ $cm^2V^{-1}s^{-1}$. This is includes embodiments of the oxide heterostructures in which the electrons of the 2DEG have a Hall mobility at a temperature in the range from 1 K to 10 K of at least $5\times10^2$ $cm^2V^{-1}s^{-1}$, further includes embodiments of the oxide heterostructures in which the electrons of the 2DEG have a Hall mobility at a temperature in the range from 1 K to 10 K of at least $6\times10^2$ $cm^2V^{-1}s^{-1}$, and still further includes embodiments of the oxide heterostructures in which the electrons of the 2DEG have a Hall mobility at a temperature in the range from 1 K to 10 K of at least $8\times10^2$ $cm^2V^{-1}s^{-1}$. Notably, in some embodiments of the heterostructures, the holes of the 2DHG have a Hall mobility that is as high as, or is higher than, the Hall mobility of the electrons in the 2DEG, at least at a temperature in the range from 1 K to 50 K. The highly mobile electrons and holes in the 2DEG and 2DHG, respectively, are well confined at their respectively interfaces, typically within a distance of 4 nm or less, for example, 3 nm or less.

The heterostructures can be incorporated into a variety of electronic devices, including transistors, such as field effect transistors. One embodiment of a transistor includes a source electrode in electrical communication with the 2DEG or with the 2DHG, a drain electrode in electrical communication with the same 2DEG or 2DHG, and a gate electrode that is configured to alter the current flowing between the source electrode and the drain electrode when a gate voltage is applied to the gate electrode. Two components can be considered to be in electrical communication if there is a path through which electrons can flow from one component to the other when a voltage is applied. The two components can be, but need not be, in direct contact.

Figure 13:
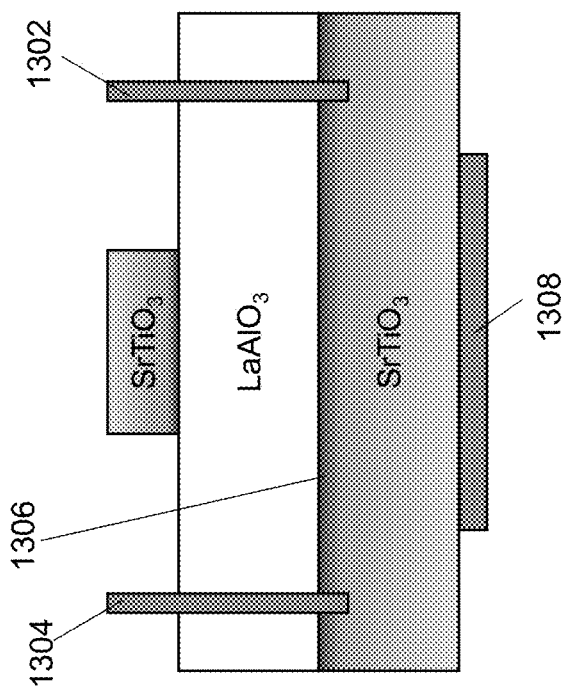
FIG. 13 is a schematic diagram showing a cross-sectional view of an n-channel transistor. The n-channel transistor uses the 2DEG of the bottom LAO/STO interface as an n-type channel and the STO substrate (base layer) as a back gate dielectric layer.
Figure 15:
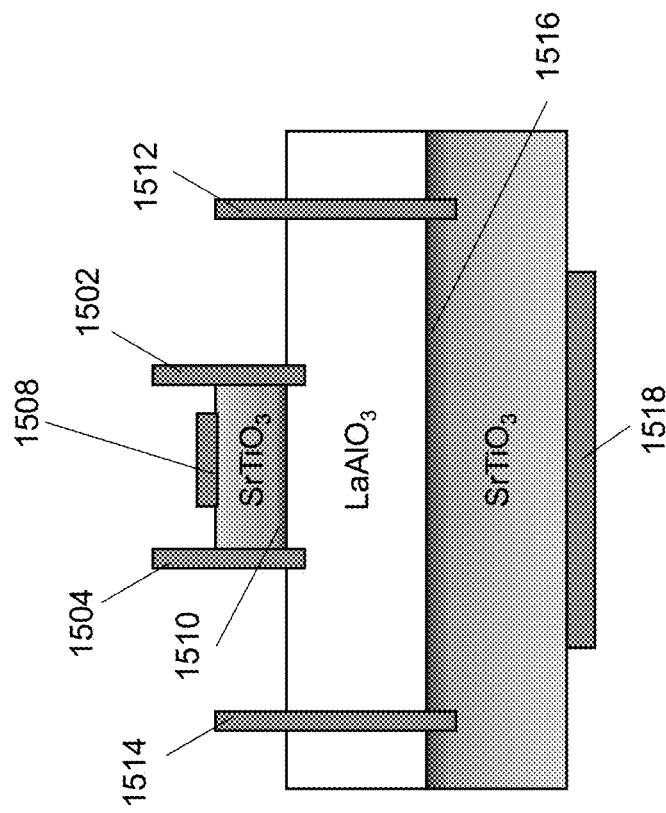
FIG. 15 is a schematic diagram showing a cross-sectional view of a bidirectional transistor that uses both the 2DEG and the 2DHG as channel layers.

The transistor may be an n-channel transistor (FIG. 13) in which the source electrode 1302 and the drain electrode 1304 are in electrical communication with the 2DEG 1306 of the heterostructure and the gate electrode is a back gate electrode 1308, configured to alter the flow of current between source electrode 1302 and drain electrode 1304 when a gate voltage is applied. In the n-channel transistor, source electrode 1302 and the drain electrode 1304 are in electrical communication through 2DEG 1306, which serves as the n-channel. Back gate electrode 1308 is disposed over the n-channel 2DEG between the source electrode and the drain electrode.

Figure 14:
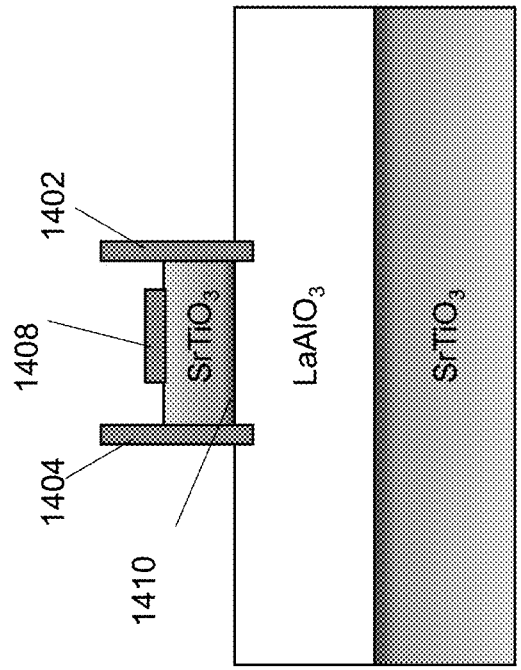
FIG. 14 is a schematic diagram showing a cross-sectional view of a p-channel transistor. The p-channel transistor uses the 2DHG of the top STO/LAO interface as a p-type channel and the top STO film as a gate dielectric layer.

Alternatively, as shown in FIG. 14, the transistor may be a p-channel transistor in which the source electrode 1402 and the drain electrode 1404 are in electrical communication with the 2DHG 1410 of the heterostructure and the gate electrode 1408 is configured to alter the flow of current between source electrode 1402 and drain electrode 1404 when a gate voltage is applied. In the p-channel transistor, source electrode 1402 and drain electrode 1404 are in electrical communication through 2DHG 1410, which serves as the p-channel. Top gate electrode 1408 is disposed over the p-channel 2DHG between the source electrode and the drain electrode.

The transistor also may be a bidirectional transistor (FIG. 14) that includes: a first source electrode 1502 and a first drain electrode 1504, wherein first source electrode 1402 and first drain electrode 1406 are in electrical communication through the 2DHG 1510 of the heterostructure; a second source electrode 1512 and a second drain electrode 1514, wherein second source electrode 1512 and second drain electrode 1514 are in electrical communication through 2DEG 1510; a first gate electrode 1508 configured to alter the flow of current between first source electrode 1502 and first drain electrode 1504 through 2DHG 1510 when a gate voltage is applied to the first gate electrode; and a second gate electrode 1518 configured to alter the flow of current between second source electrode 1512 and second drain electrode 1514 through the 2DEG 1516 when a gate voltage is applied to the second gate electrode.

EXAMPLE

Figure 3A:
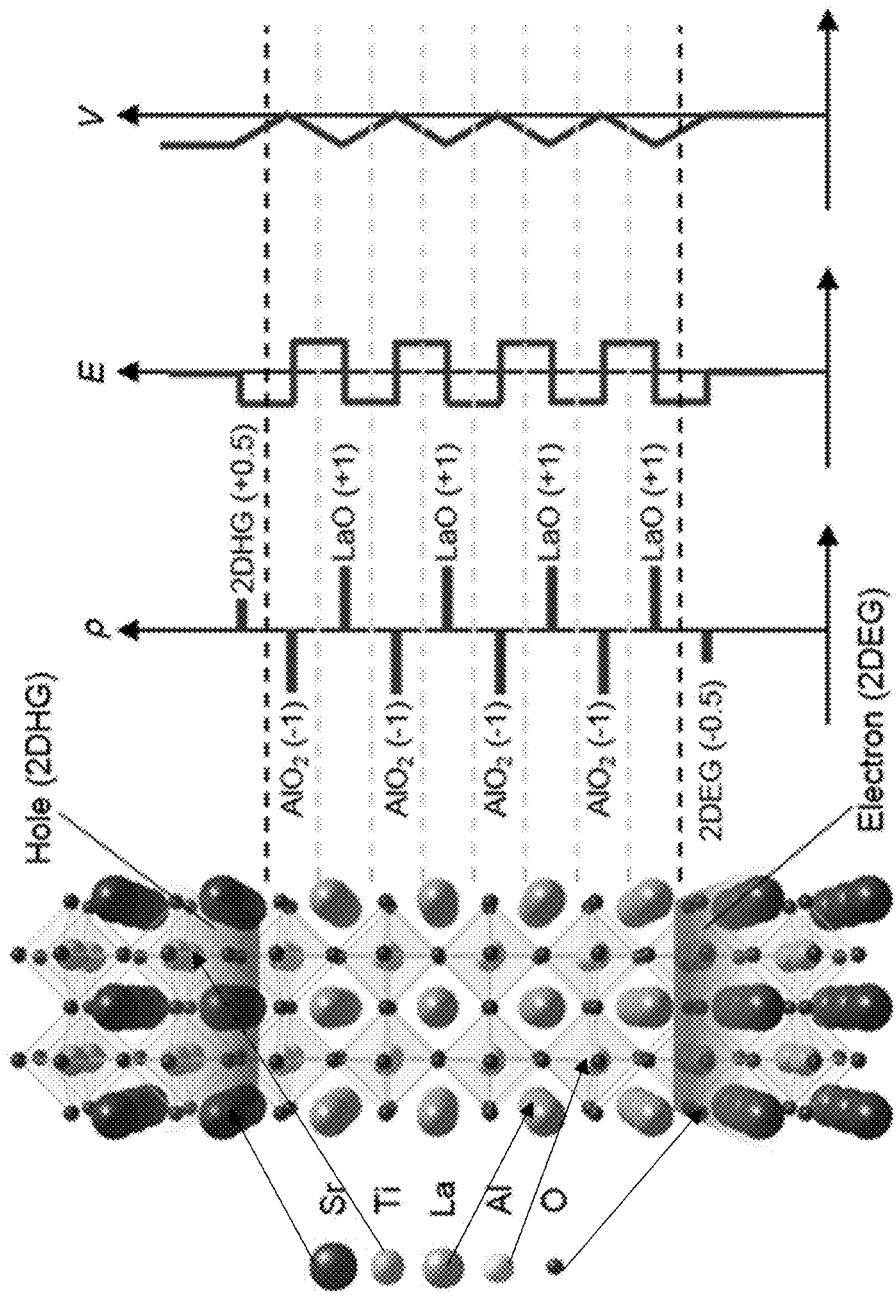
FIGS. 3A-3D depict atomically-abrupt p-type interfaces in epitaxially-grown STO/LAO/STO heterostructure.

This example illustrates the fabrication of $SrTiO_3$/$LaAlO_3$/$SrTiO_3$ (STO/LAO/STO) heterostructures to realize a 2DHG. As shown in FIG. 3A, if the STO substrate is $TiO_2$-terminated, p-type and n-type interfaces are expected to form at the top and the bottom of the STO/LAO/STO heterostructure, respectively, to avoid a polar catastrophe. The first-principles calculations (FIGS. 7A, 7B, and 7C) indeed demonstrated the accumulation of n-type carriers at the bottom interface and p-type carriers at the top interface consistent with the polar catastrophe model. The polar discontinuity may, however, also be resolved by the accumulation of positively-charged oxygen vacancies at the top interface. This is evident from the first-principles calculations (FIG. 7C) indicating the absence of the 2DHG when oxygen vacancies were formed in STO or LAO close to the top interface. This implies that, even though one can fabricate a high-quality p-type interface, the interface may still be insulating due to the ionized oxygen vacancies. Therefore, to practically realize 2DHG, two issues must be addressed: (1) building a high-quality p-type interface composed of SrO/$AlO_2$ layers, and (2) minimizing oxygen vacancies near the p-type interface.

Figure 3C:
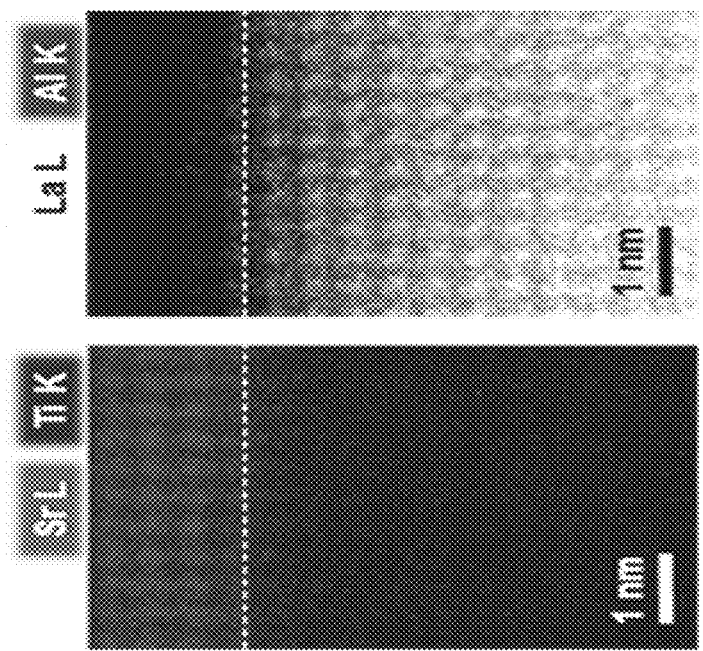
Figure 3B:
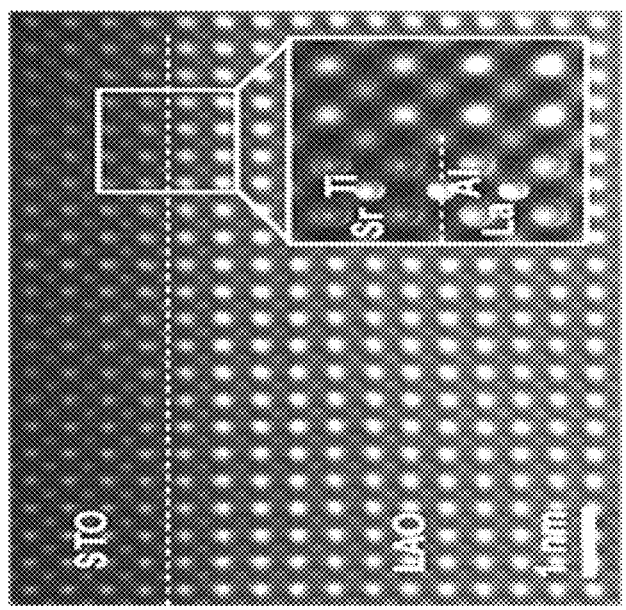

STO/LAO thin films were synthesized using pulsed laser deposition (PLD) with in-situ monitoring of reflection high-energy electron diffraction (RHEED) on $TiO_2$-terminated (001) STO substrates (FIGS. 8A, 8B, 8C, and 8D). To minimize the oxygen vacancy formation during growth, oxygen partial pressure in the chamber was kept as high as $10^{-3}$ mbar for LAO growth and $10^{-2}$ mbar for STO growth, respectively. The samples were also in-situ post annealed in an oxygen ambient (See Methods). Scanning transmission electron microscopy-annular dark-field (STEM-ADF) images taken from the STO (10 unit-cells)/LAO (40 unit-cells)/STO heterostructure are given in FIG. 3B. The top STO/LAO interface is atomically abrupt and smooth. Such an atomically-well defined interface is desirable for realizing a 2DHG because the atomic intermixing at the interface can reduce the potential difference between the consecutive layers and negate the interface band bending that is crucial for the interfacial charge confinement. The magnified atomic structure (the inset in FIG. 3B) clearly indicates that a high-quality $SrO/AlO_2$ interface has been built between the top STO and the LAO thin films. Atomic-scale energy dispersive X-ray spectroscopy (EDS) elemental mapping was performed on the same sample (FIG. 3C). The EDS maps show the chemically-abrupt top interface with atomic intermixing limited to ~1 unit-cell.

Figure 3D:
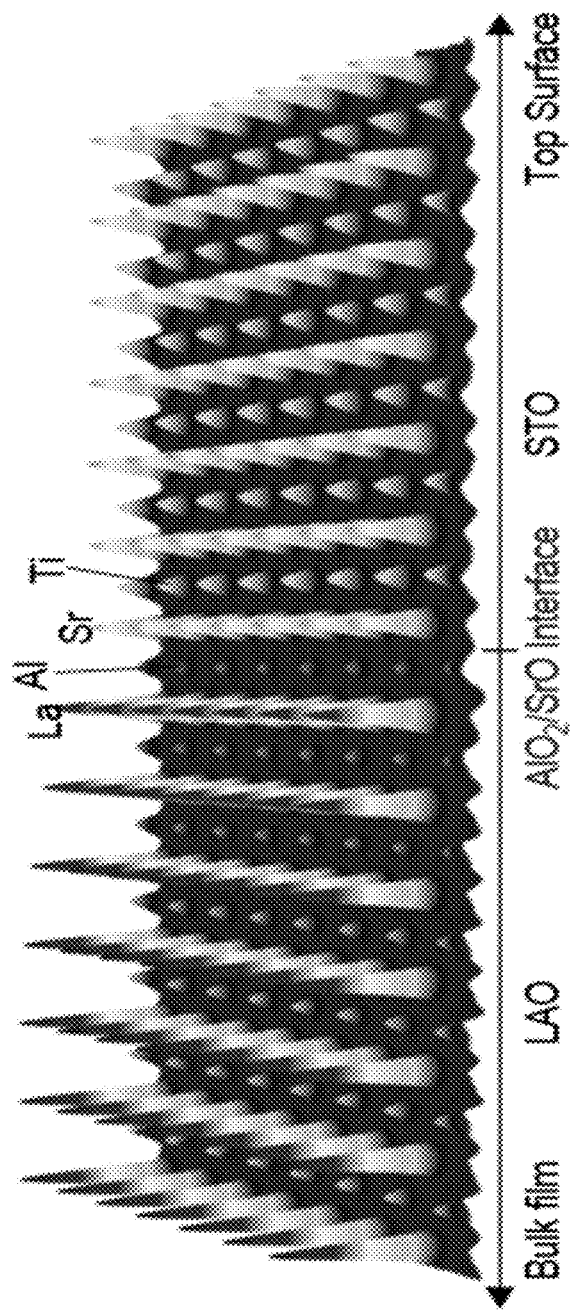

To verify the atomic structure in more detail, synchrotron X-ray crystal truncation rod (CTR) measurements were performed and subsequently analyzed using the coherent Bragg rod analysis (COBRA) method (FIGS. 9A, 9B, 9C, 9D, 9E, and 9F). FIG. 3D shows the COBRA-derived cation electron density map across the top interface. The electron density sharply changed at the interfaces, indicating the high quality of the interface with a minimal intermixing. The clearly discernible difference in integrated electron numbers at the interface (FIG. 9E) show that the top STO/LAO interface consisted of SrO and $AlO_2$ layers as designed. This consistency between the atomic design and the actual atomic structure is important because non-uniform atomic terminations or severe atomic intermixing at the interface involve intricate and non-trivial phenomena affecting the overall band structures in oxide heterostructures that may be detrimental to the 2DHG formation.

Figure 4B:
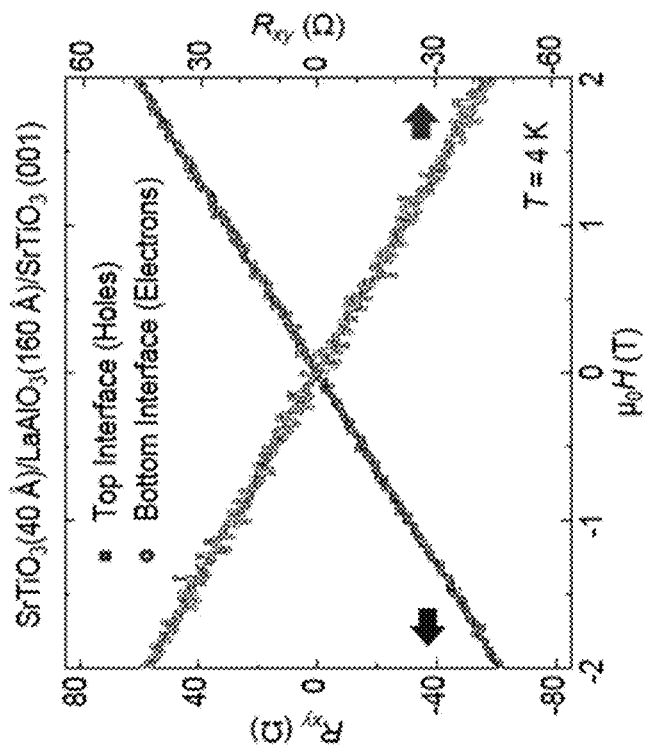
FIGS. 4A-4E depict electrical transport properties of a 2DHG and a 2DEG in the STO/LAO/STO heterostructure.
Figure 4A:
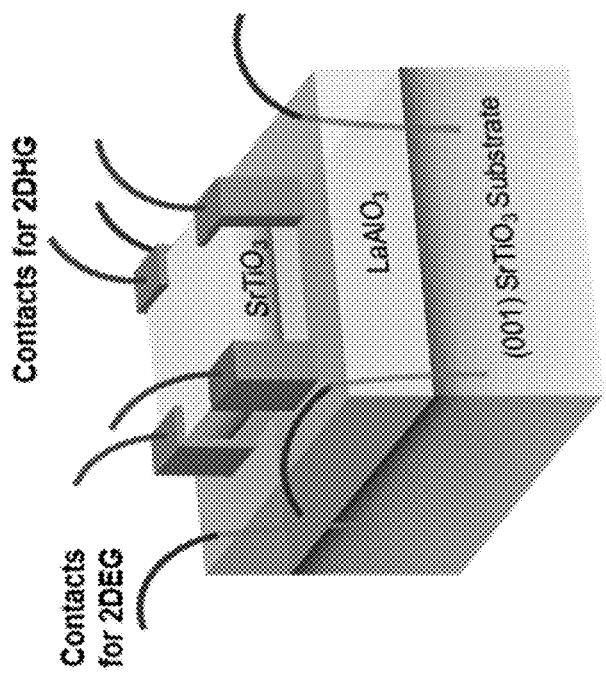
Figures 4C, 4D, 4E:
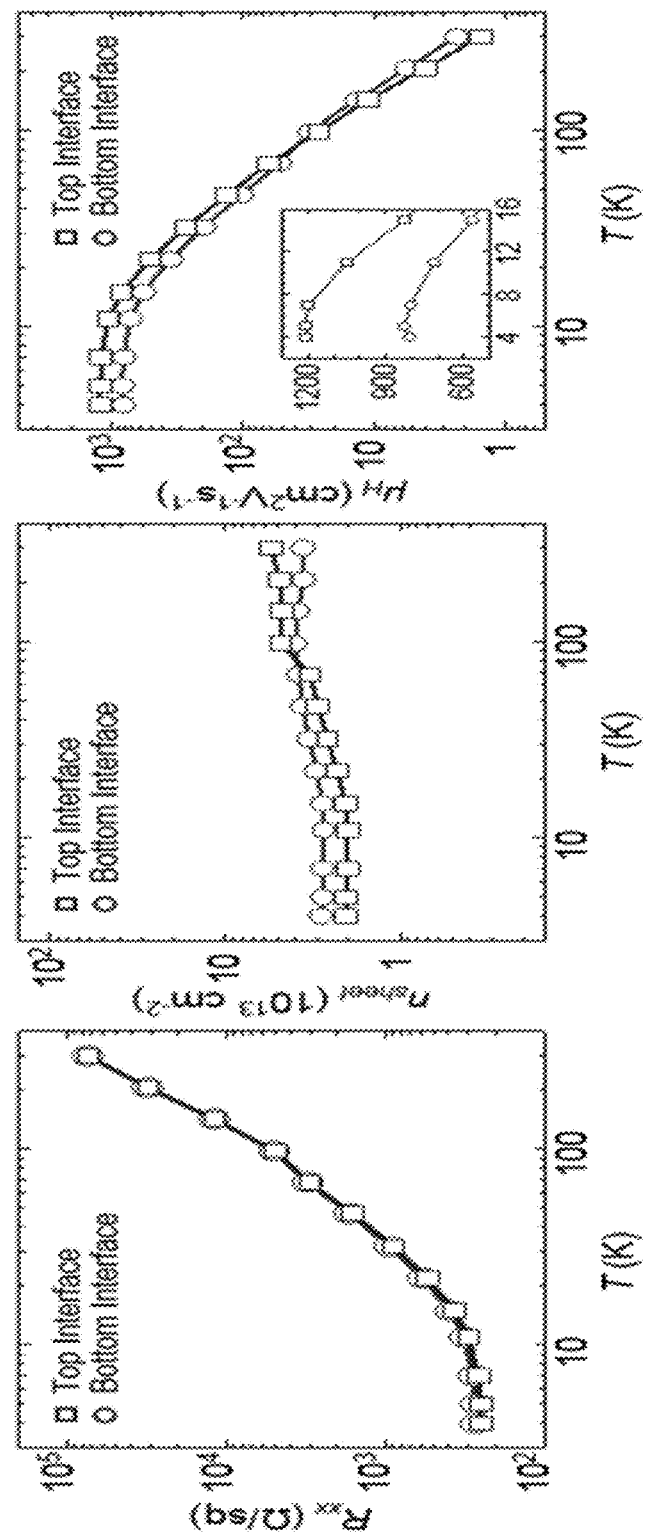

The electrical transport properties of the top and the bottom interfaces in the STO/LAO/STO heterostructure were examined. To separately measure the transport of each interface, the top STO film was square-patterned. Then, 4 corners of the STO were covered by metal pads (FIGS. 10A, 10B, 10C, 10D, 10E, 10F, and 10G). In this way, the top interface could be contacted only by the metal pads, while the bottom interface could be contacted by a conventional wire-bonding method (FIG. 4A). The magnetic field-dependent Hall resistance $R_{xy}$ (H) is given in FIG. 4B. The top interface clearly showed p-type conductivity as opposed to the bottom interface. The temperature-dependent sheet resistance $R_{xx}$ (T) of the top and bottom interfaces are given in FIG. 4C. The $R_{xx}$ of the interfaces were found to be quite similar to each other for a wide range of temperatures (4 K-300 K). The sheet carrier densities $n_{sheet}$ (T) of both interfaces were not strongly dependent on temperature (FIG. 4D). On the other hand, their Hall mobility μH (T) showed a clear temperature dependency (FIG. 4E). At low temperatures, the mobility of both electrons and holes was roughly independent of temperature since the transport was dominated by defect scattering. As the temperature increased, the mobility decreased with temperature since the phonon scattering started to dominate the scattering mechanism.

It is notable that the mobility of 2DHG was comparable and even slightly higher than the mobility of 2DEG at low temperature (see the inset of FIG. 4E). This was a surprising result because holes are usually known to be less mobile with higher effective mass than electrons. The calculated electron mass at the conduction band minimum was about 0.4 $m_o$ for the $d_{xy}$ band and about 0.9 $m_o$ for the $d_{xz,yz}$ bands. These values were smaller than the effective hole mass of 1.2 $m_o$ calculated at the valence band maximum. These estimates, however, did not take into account the electron-phonon coupling which renormalizes the effective masses of carriers. The electrons were strongly coupled to phonons in the LAO/STO system forming large polarons. As the result, the effective electron mass renormalized to a larger value of 2.5 $m_o$. In contrast, holes were weakly coupled to phonons, which is evident from the calculated electron-phonon coupling matrix element for the valence band maximum being seven times smaller than that at the conduction band minimum. Hence, taking into account the electron-phonon coupling, it is likely that the effective mass of holes is comparable or even smaller than the effective mass of electrons. This qualitatively explains why the relatively large hole mobility was comparable to the electron mobility.

Figure 5A:
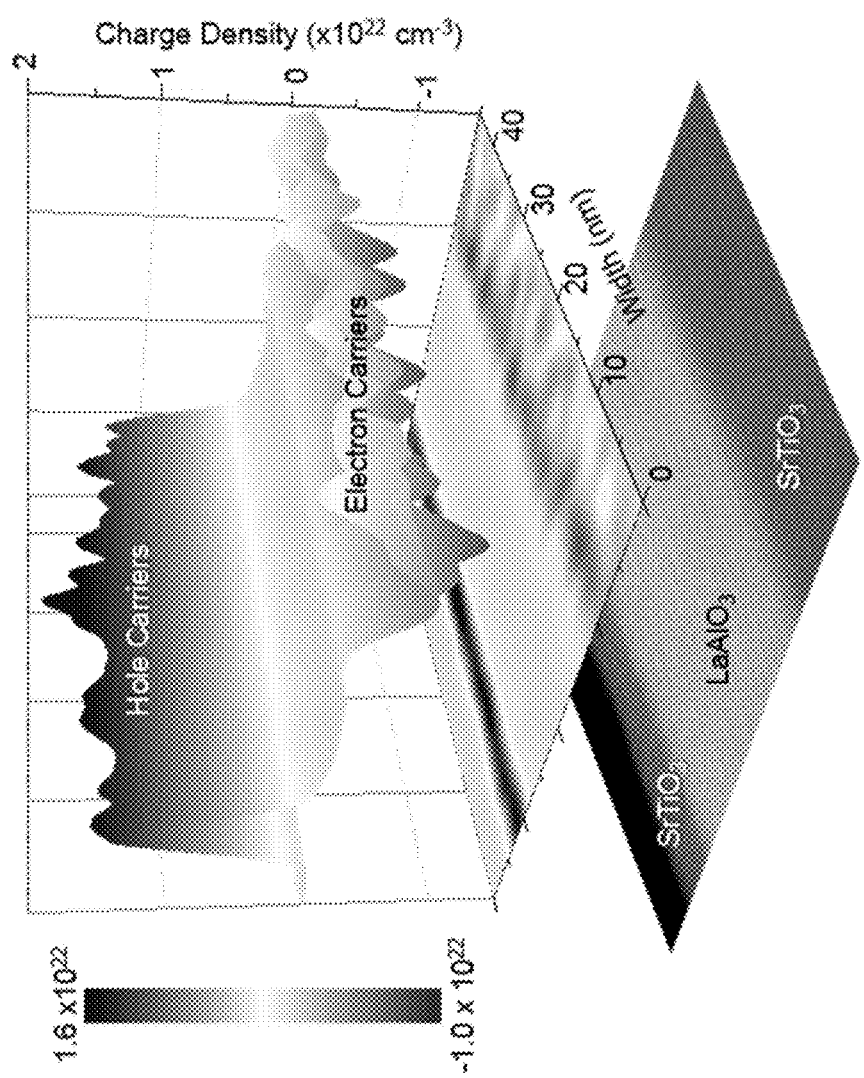
FIGS. 5A and 5B depict charge distribution in the STO/LAO/STO heterostructure.

Using an in-line electron holography technique, it was directly demonstrated that the 2DHG was indeed formed at the STO/LAO interface. The map of charge distribution in the STO/LAO/STO heterostructure is given in FIG. 5A. A high density of positive charges was clearly observed at the top STO/LAO interface. The bottom interface showed the opposite negative charges that are the 2DEG. Considering the high conductivity at both interfaces, those positive and negative charges at each interface are hole and electron carriers rather than localized ionic charges. If the observed positive charges mainly originated from ionized oxygen vacancies, it would have been seen as local expansion of lattice spacing. However, the lattice spacing profile obtained by 3D-COBRA (FIG. 9F) did not show such signals.

Figure 5B:
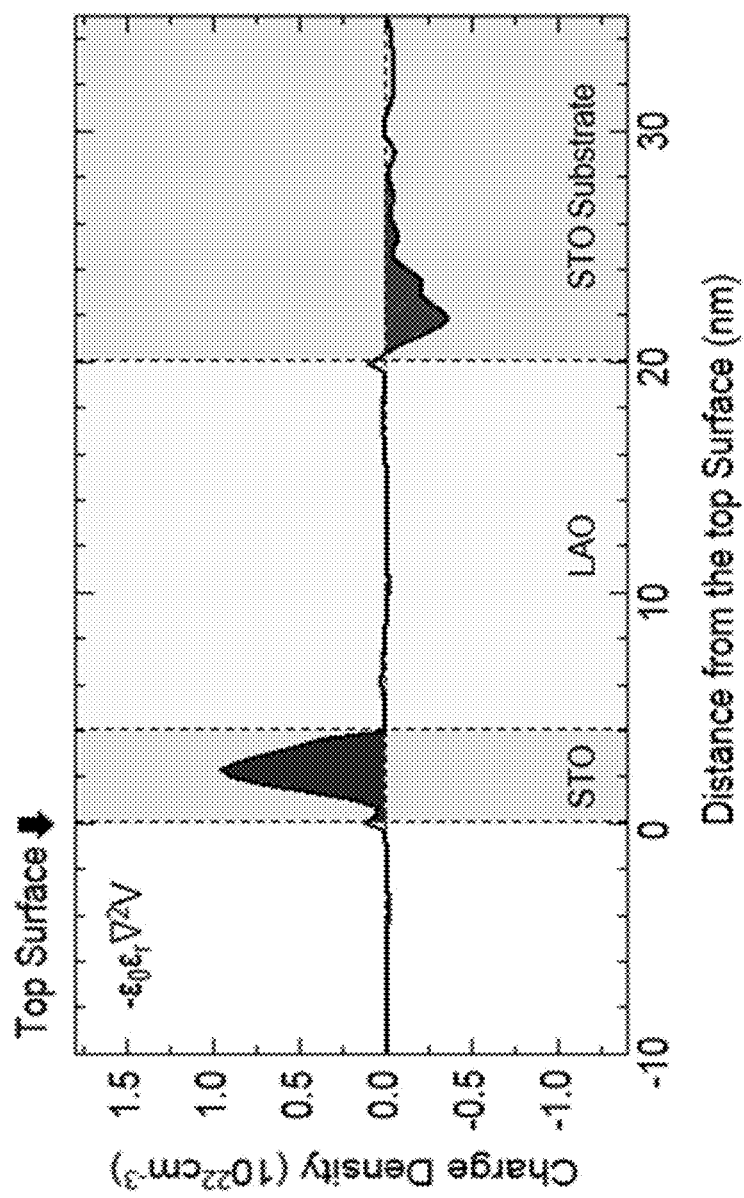

FIG. 5B shows the charge density profile across the top and bottom interfaces. Note that the distribution of holes is uniform and well-confined to the p-type interface within ~2 nm. The narrow and uniform distribution of holes is probably related to the fact that there are no hole-doping defects, such as oxygen vacancies providing additional electrons to 2DEG, which cause a broad and inhomogeneous charge distribution in the bulk region. Even though the electron distribution at the bottom interface is slightly broader than the hole distribution at the top interface, the 2DEG is also well confined to the bottom interface within only ~3 nm. This indicates that the oxygen vacancy doping is also not significant in our STO/LAO/STO heterostructure.

The presence of hole carriers at the top interface can be more strongly supported by verifying the lack of oxygen vacancies near the interface. Electron energy-loss spectroscopy (EELS) study, which can show the underlying electronic structures of materials, was performed to determine the oxygen deficiency in the STO/LAO/STO heterostructure (FIGS. 11A, 11B, 11C, 11D, and 11E). The top STO layer showed an EELS edge shape that was nearly identical to that of the STO bulk region in the same sample. This result implies that the oxygen deficiency of the top STO thin film is not severe enough to change the EELS fine structure. However, since even a smaller amount of point defects, which is less than the EELS sensitivity, can significantly affect the band structure of oxide system, the absence of oxygen vacancy needed to be confirmed by an additional technique with a higher sensitivity.

Figure 12A:
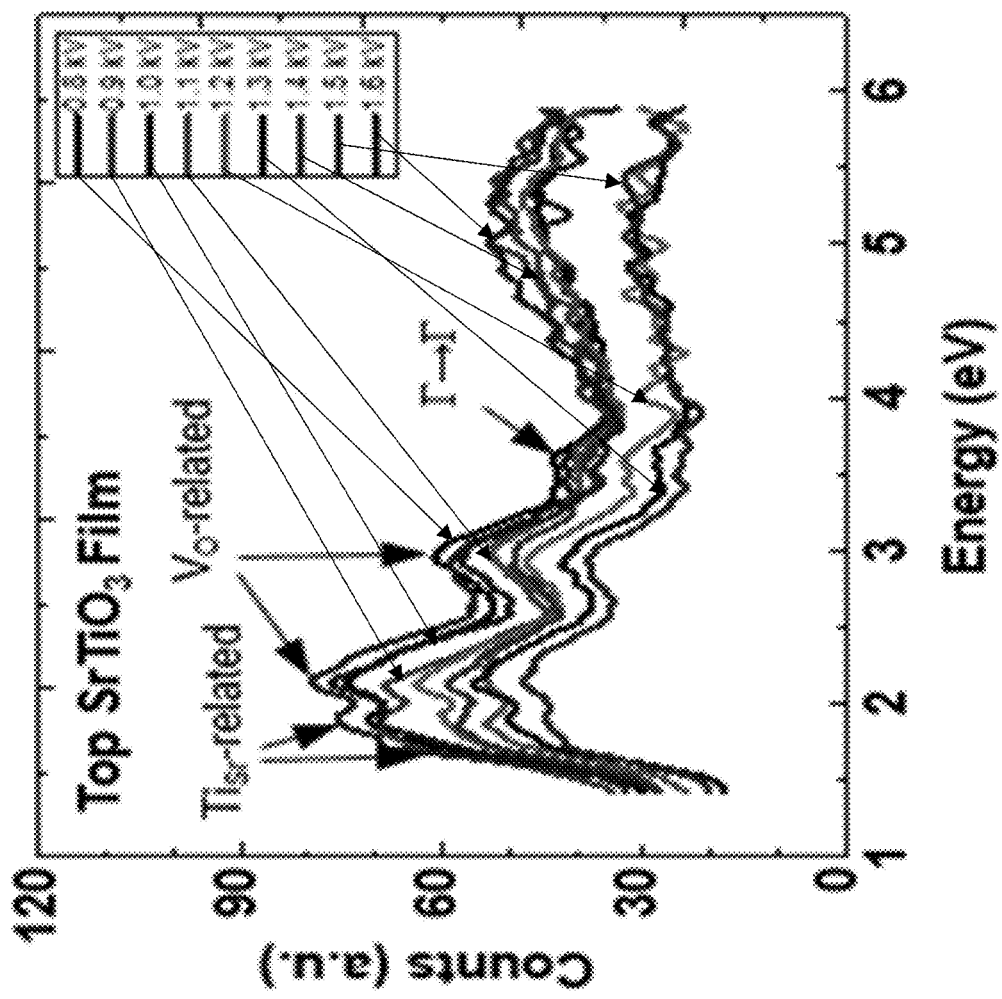
FIGS. 12A-12C depict CLS data at different depth positions.
Figure 12B:
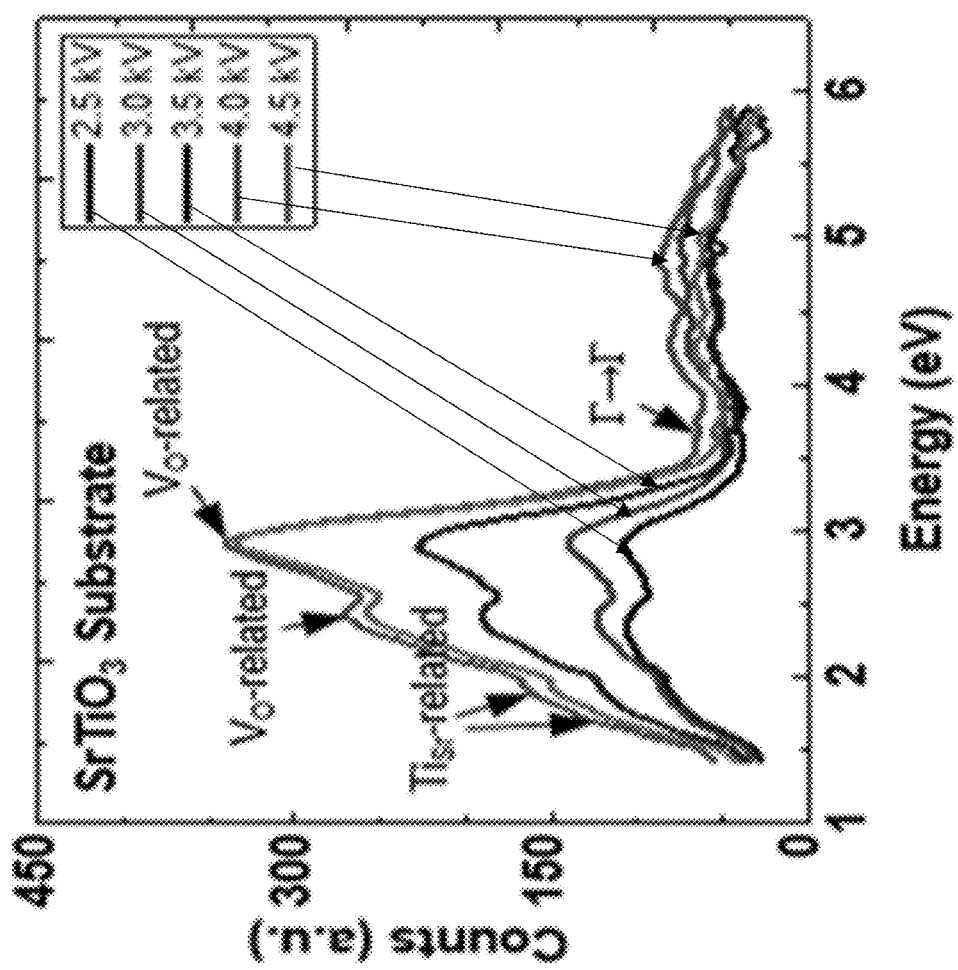
Figure 12C:
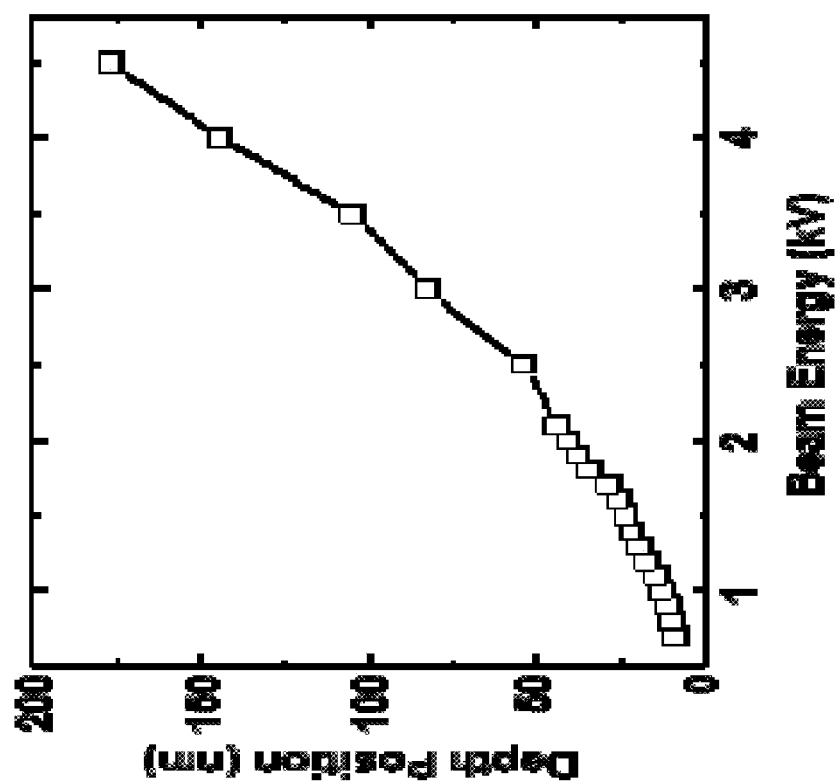

To obtain more detailed information about the oxygen vacancy distribution, depth-resolved cathodoluminescence spectroscopy (DR-CLS) analyses were performed on the STO/LAO/STO heterostructure. The DR-CLS, in which the penetration depth of the incident electron beam varies with beam energy, provided information on defect optical transitions as well as band-to-band transition of the oxide material (FIG. 6A). The line profile of the oxygen vacancy index, which directly reflects the density of oxygen vacancies, is given in FIG. 6B (see Methods). The top STO film exhibited considerably small signs of oxygen vacancies, even smaller than that of the bulk STO substrate. The small amount of oxygen vacancies in the top STO film showed no depth-dependency, while the amount of oxygen vacancy in the bulk STO increased with depth. Since the formation energy of an oxygen vacancy is the highest at the n-type interface, the density of oxygen vacancies is expected to increase with distance away from the interface into the bulk region. The representative CL spectra obtained from the top STO and the bulk STO substrate are given in FIGS. 6C and 6D, respectively. The whole set of CL spectra is given in FIGS. 12A, 12B, and 12C. The spectrum feature of the top STO film is mainly related to oxygen vacancies. Considering the high sensitivity of CLS technique, this result implies that the top STO film does not contain any defects other than an extremely small amount of oxygen vacancy, which is consistent with EELS and COBRA results. These structural studies unambiguously demonstrated that the 2DHG was realized in oxide heterostructures containing minimal oxygen vacancies.

By realizing the 2DHG in the STO/LAO/STO heterostructure, it was demonstrated that a spatially-separated electron-hole bilayer could be established in an oxide system. Although a 40-unit-cell-thick (~16 nm) LAO barrier was utilized for the separate electrical contacts, much thinner barriers will make the two quantum-wells interact with each other more strongly. In such coupled quantum-well systems, the 2DEG and 2DHG can bind to each other, resulting in the formation of excitons.

Methods

Sample Fabrication and Electrical Characterization.

STO and LAO thin films were epitaxially grown on $TiO_2$-terminated $SrTiO_3$ (001) substrates using pulsed laser deposition (PLD) with in-situ reflection high energy electron diffraction (RHEED) monitoring. To obtain the $TiO_2$-terminated substrates, as-received STO substrates were etched using buffered-HF for 1 min, and then annealed at 900° C. for 6 hours. The atomically flat surface of the thermally-treated substrate is shown in atomic force microscopy images in FIG. 8B. During film growth, the temperature of the PLD chamber was kept as 750° C. The oxygen partial pressure for the LAO and the STO was $10^{-3}$ mbar and $10^{-2}$ mbar, respectively. After growing the STO/LAO films, the samples were in-situ post-annealed under the oxygen ambient of 1 atm at 600° C. for 1 hour. After the post-annealing process, the samples were slowly cooled down to room temperature in the oxygen ambient.

To make the square pattern of STO, a conventional photolithography technique was utilized to make the PR patterns on as-grown samples. The samples were then slowly ion-milled at a low power (milling rate of ~1 nm/min). After the ion-milling, the samples were re-patterned by photolithography to make metal pads. The metal pads of Pt (~90 nm)/Al (~20 nm) were deposited by sputtering. Lastly, Al wires were bonded on top of the metal pads for contacting to p-type interface. The n-type interface was contacted by wire-bonding directly on top of the LAO surface. The electrical transport was measured through these contacts in Van der Pauw geometry.

The electrical transport measurements were conducted using an Oxford Maglab 2000 cryostat with a superconducting solenoidal magnet over a temperature range from 4 K to 300 K. Hall measurements were performed by sourcing positive and negative currents while sweeping the magnetic field over a range from −2 T to +2 T. The current polarity was switched at less than 1 Hz, avoiding AC effects while maintaining an effectively constant field. The resistance was determined via a linear fit to the voltages measured at each current polarity. The areal carrier density was computed using the single-band equation $n_{sheet}=(dR_{xy}/dB\ q)^{-1}$ where $R_H$ is the Hall resistance, q the electron charge, and B the applied magnetic induction. Both conducting interfaces were measured during the same field sweep, but neither was current sourced nor was voltage fixed in one interface during measurement of the other.

Theoretical Calculations.

Figure 7A:
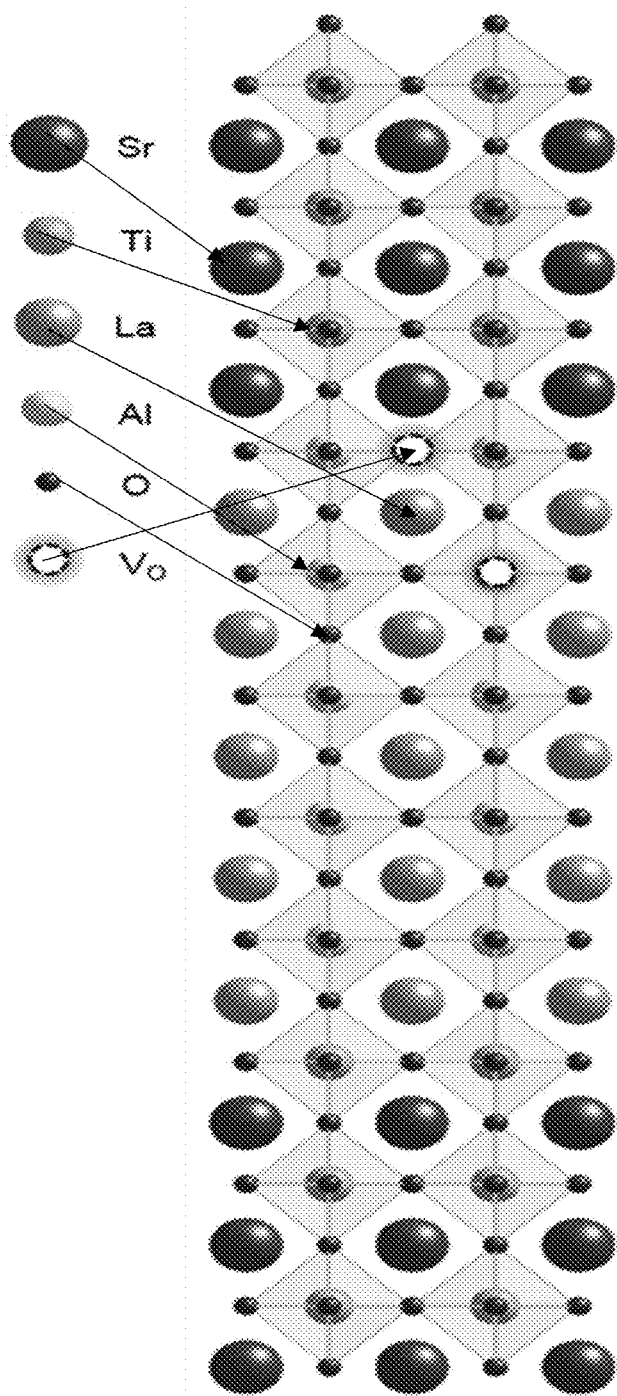
FIGS. 7A-7C depict the theoretical calculation of layer-resolved density of state (DOS) in the STO/LAO/STO heterostructure.
Figure 7B:
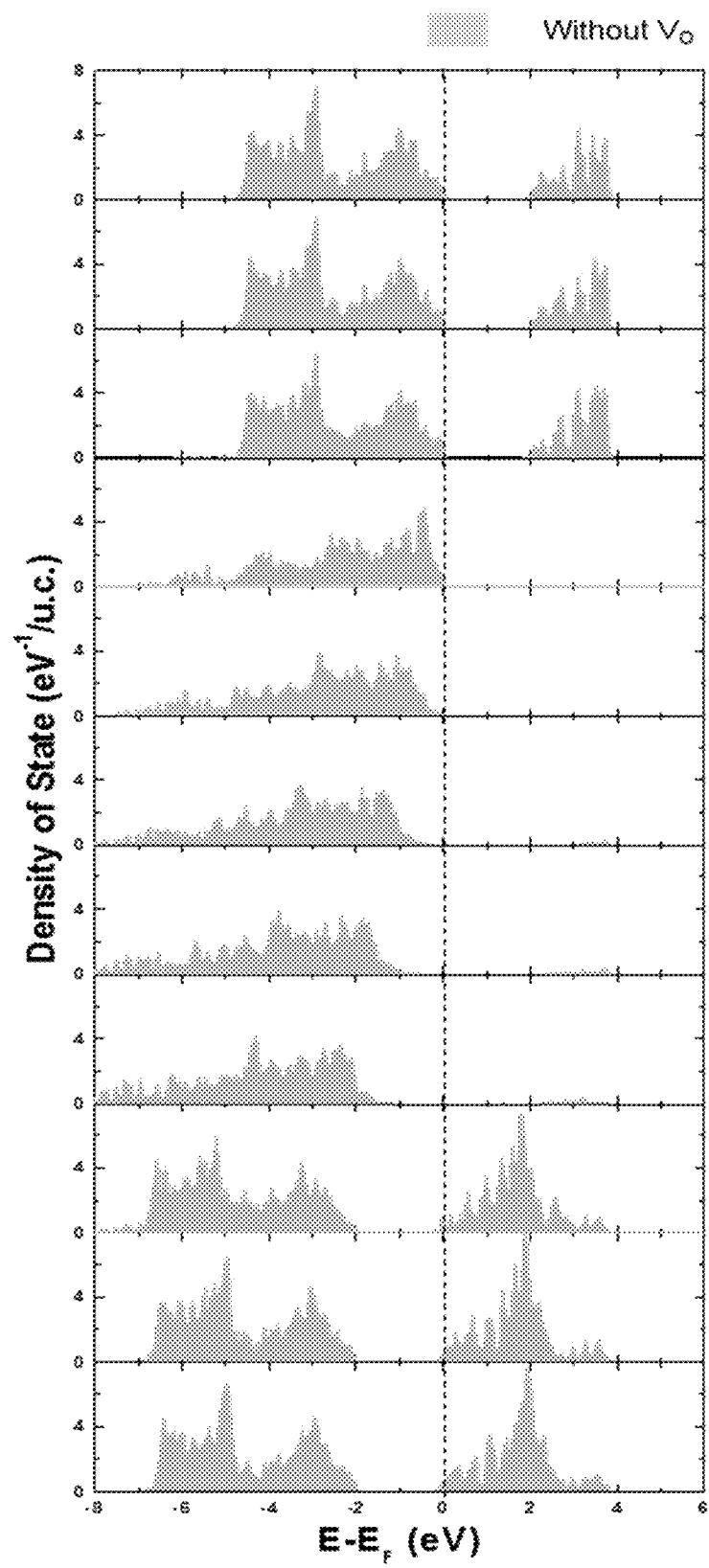
Figure 7C:
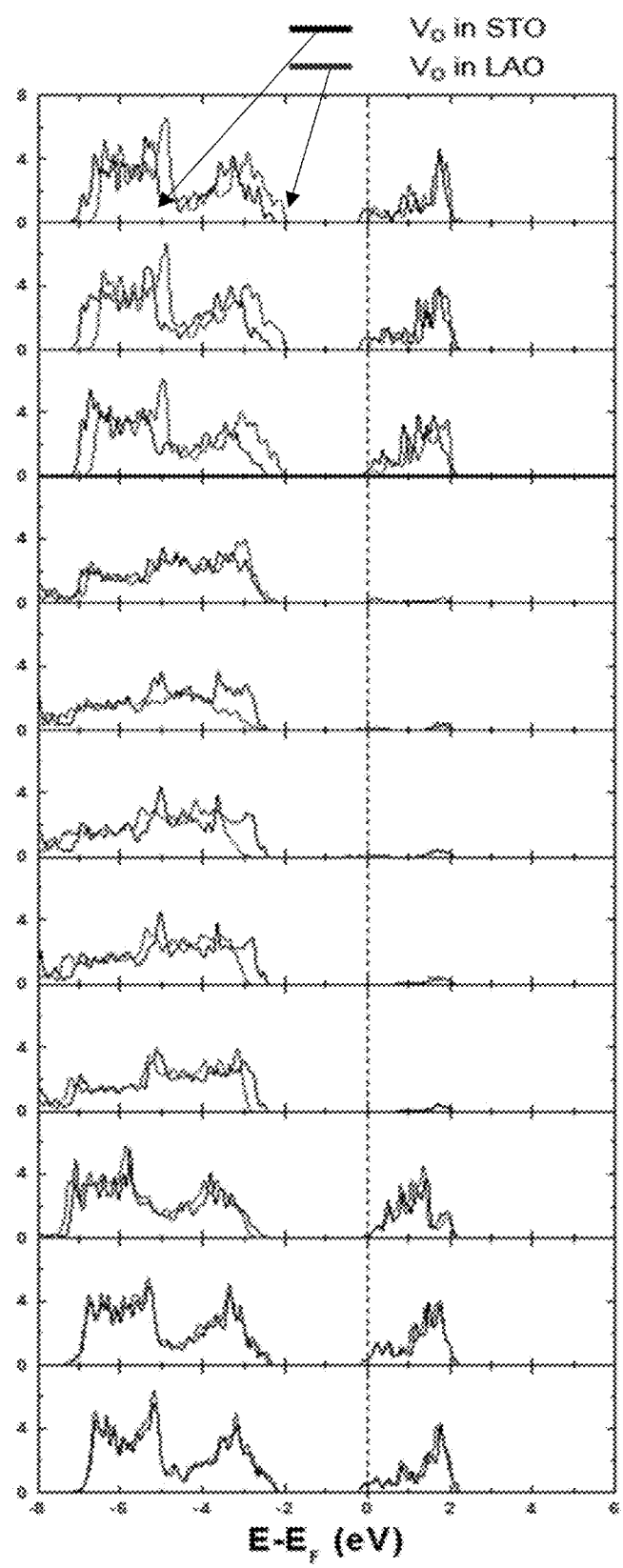
Figure 8A:
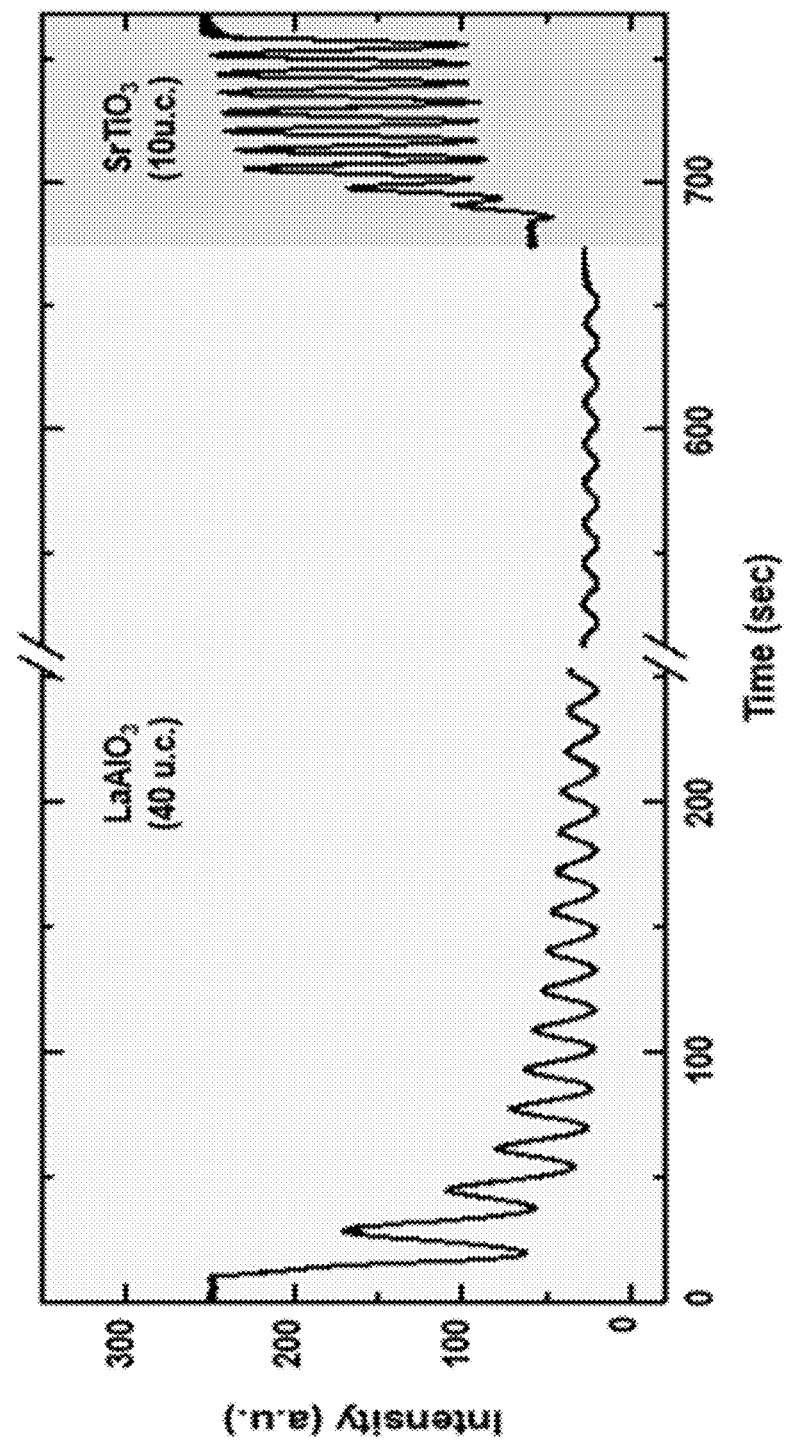
FIGS. 8A-8D depict epitaxial synthesis and structural characterization of the STO/LAO/STO (001) heterostructure.
Figure 8B:
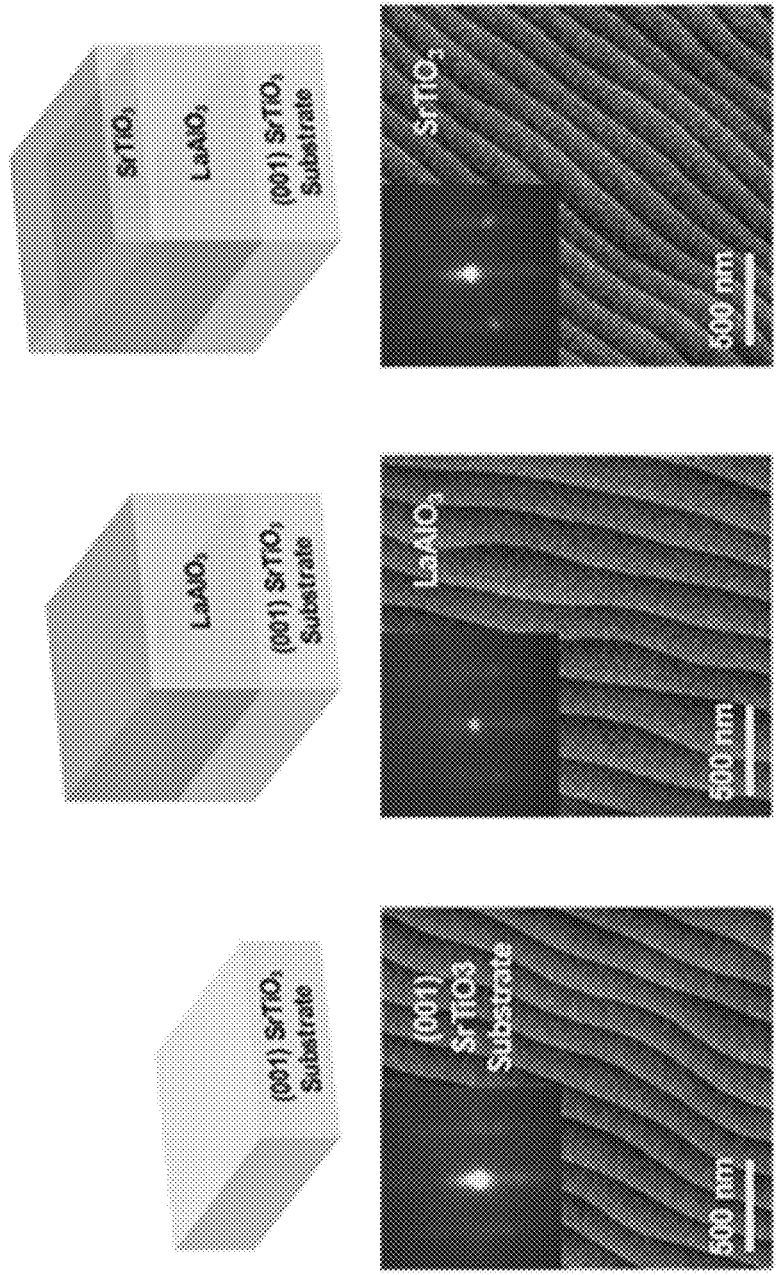
Figure 8D:
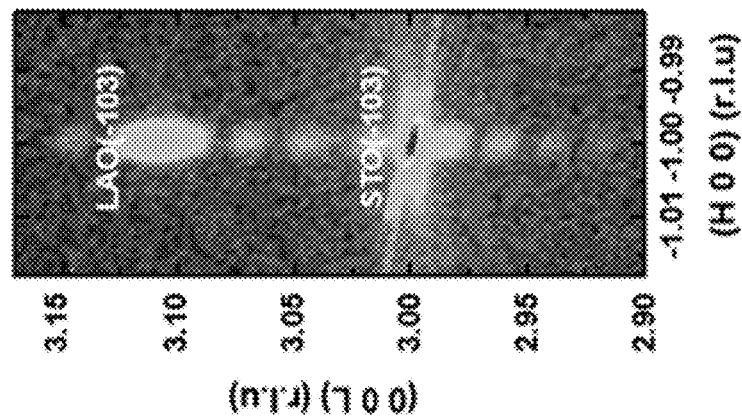
Figure 8C:
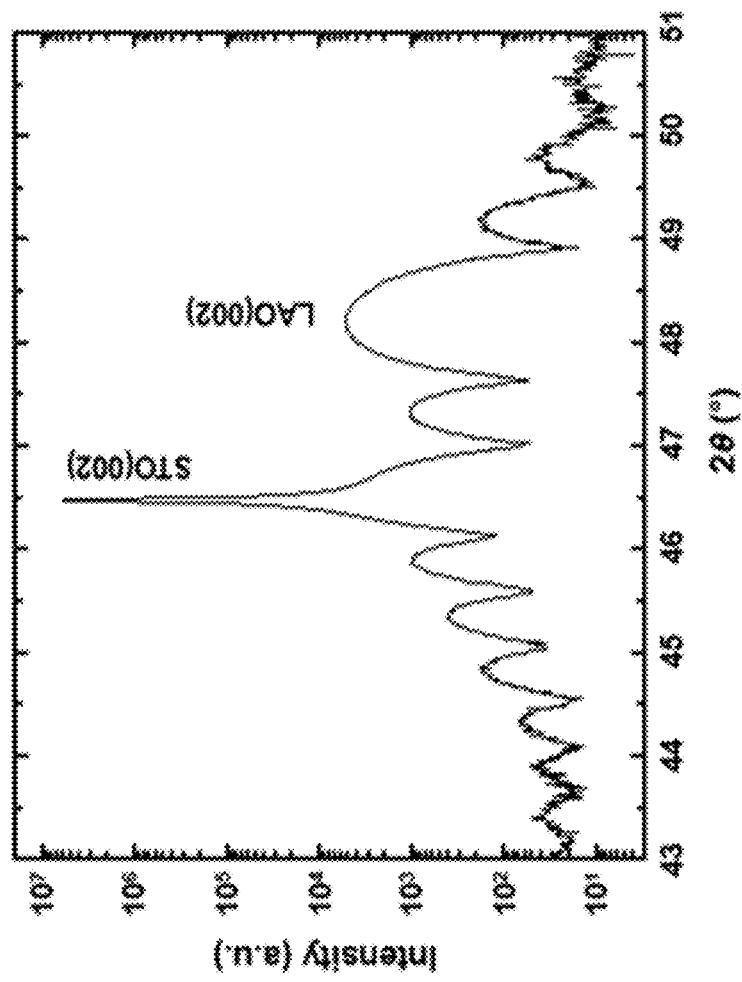
Figure 9A:
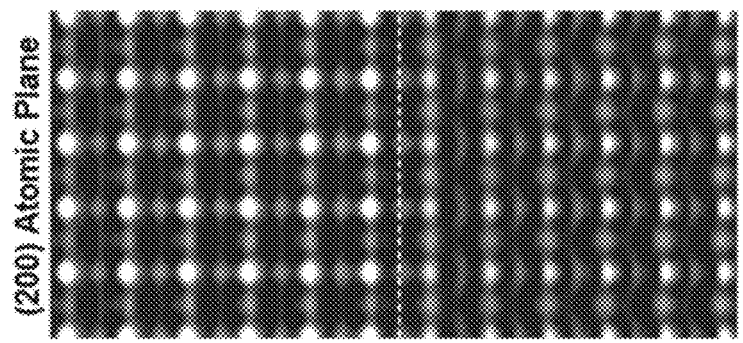
FIGS. 9A-9F depict 3D-COBRA of STO/LAO/STO heterostructure.
Figure 9B:
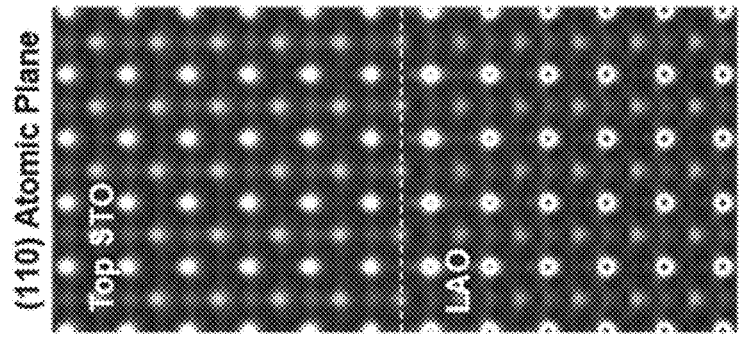
Figure 9C:
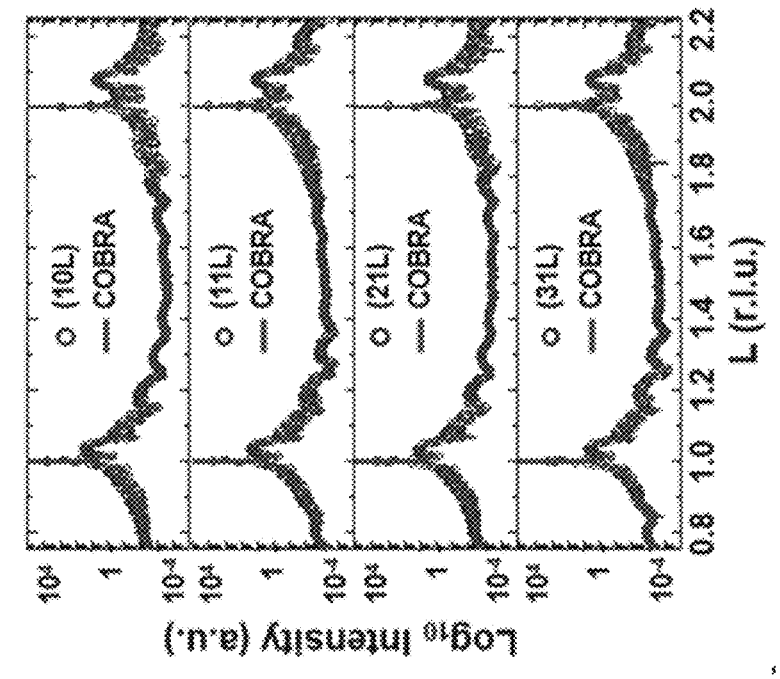
Figure 9D:
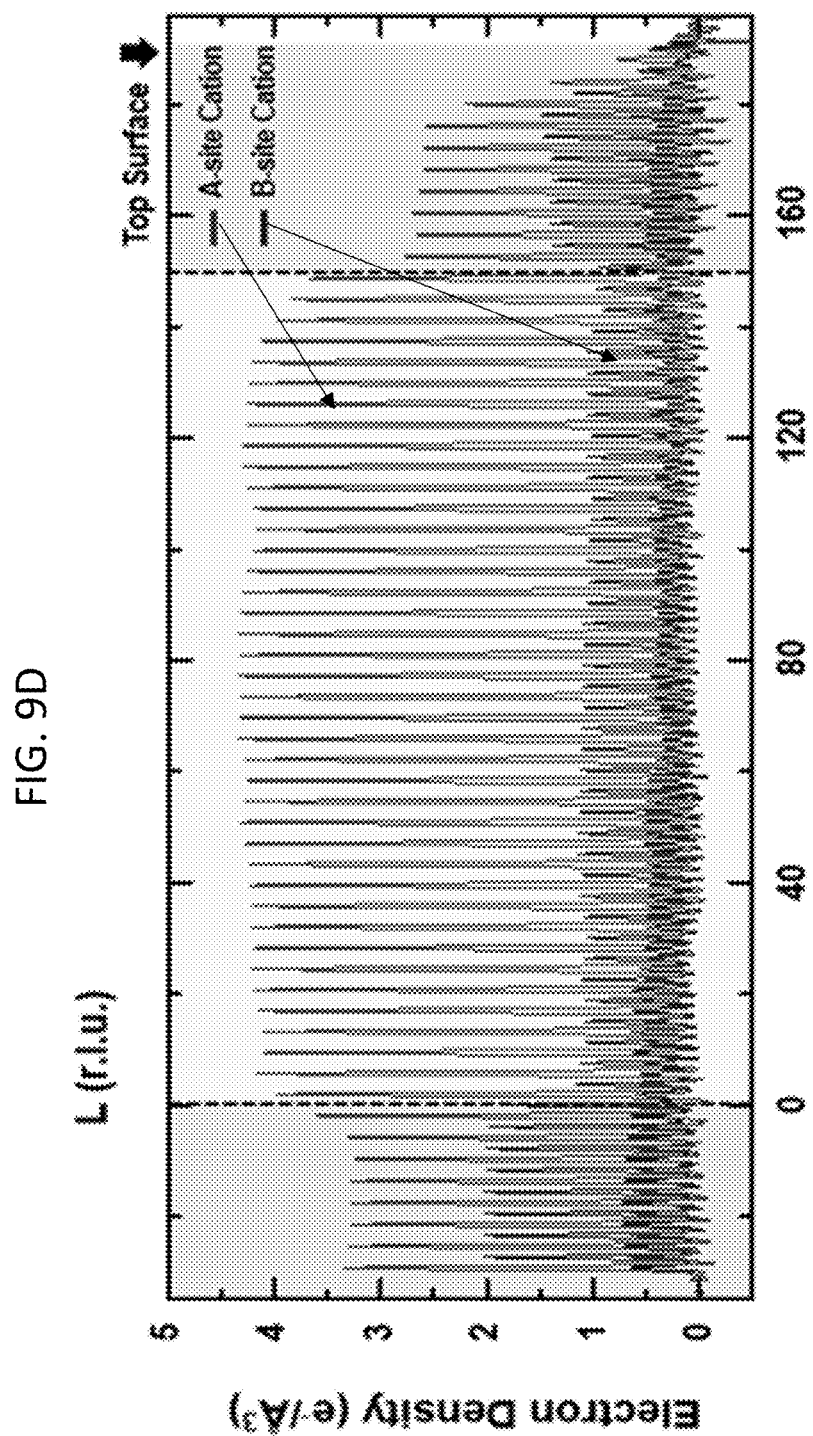
Figure 9E:
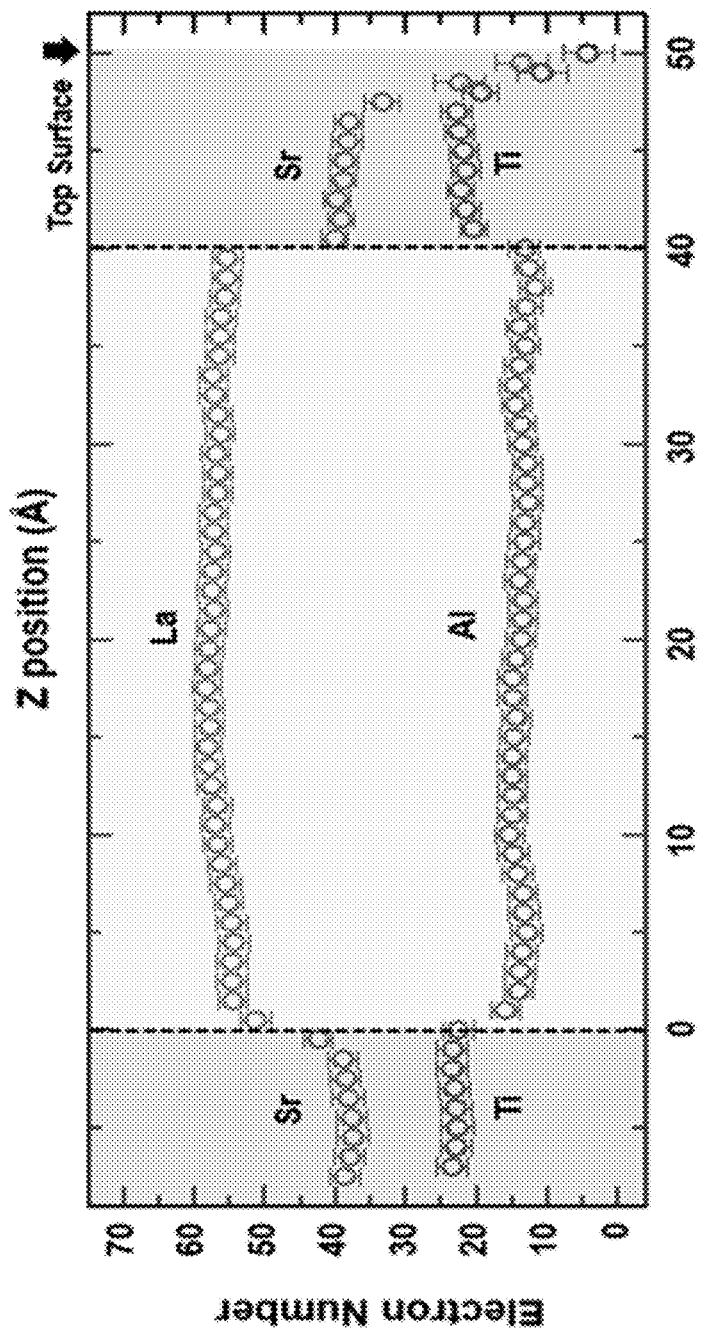
Figure 9F:
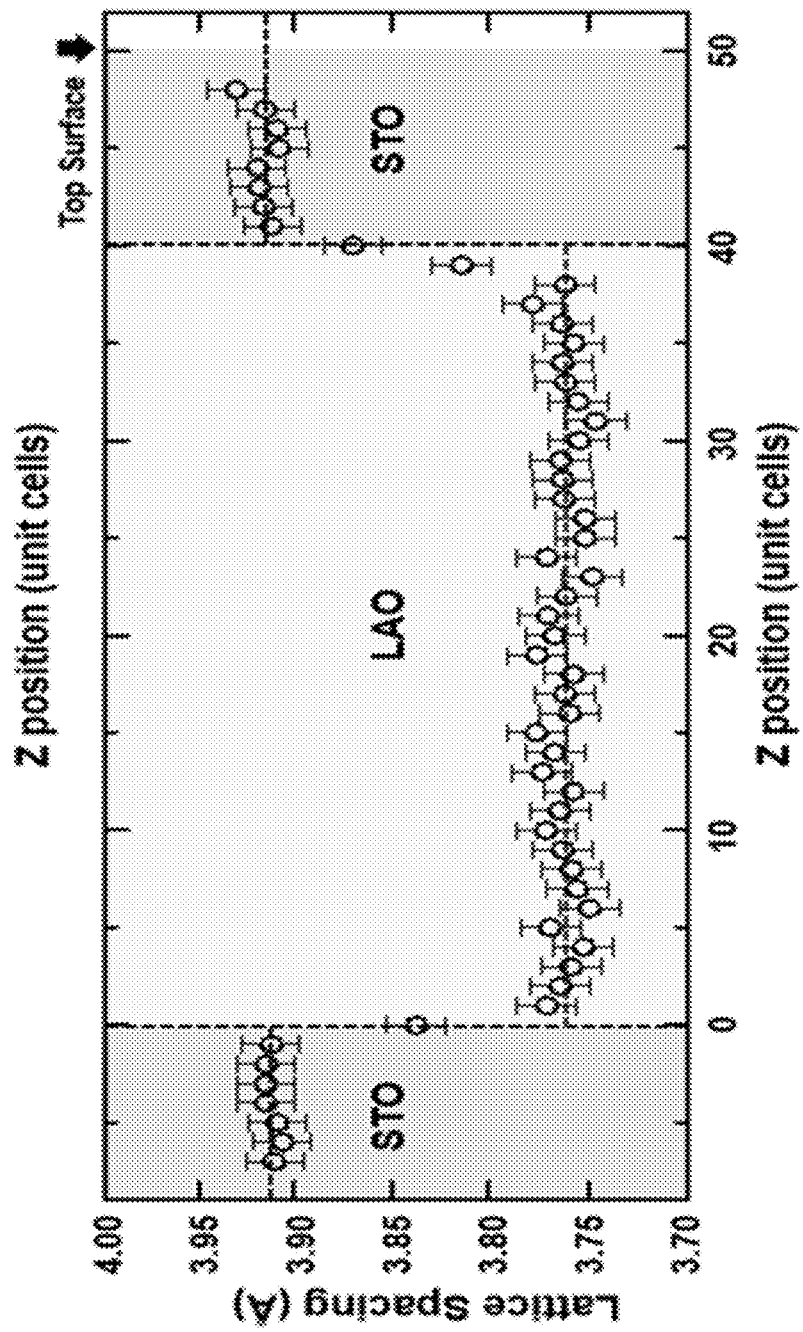
Figure 10B:
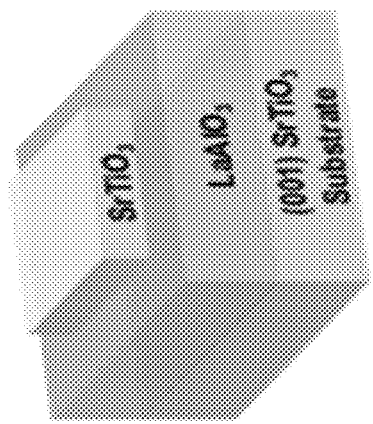
FIGS. 10A-10G depict fabrication of metal contacts for electrical characterizations.
Figure 10D:
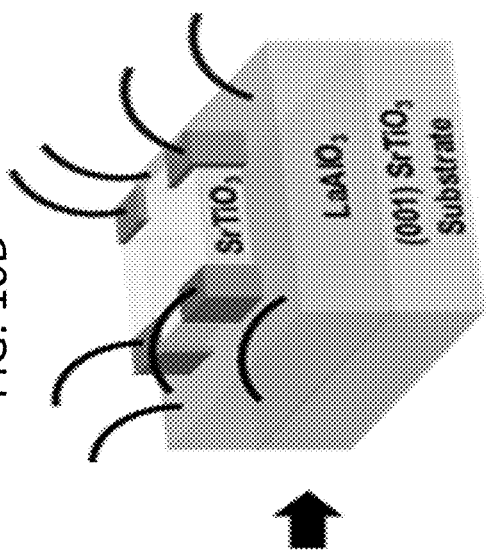
Figure 10A:
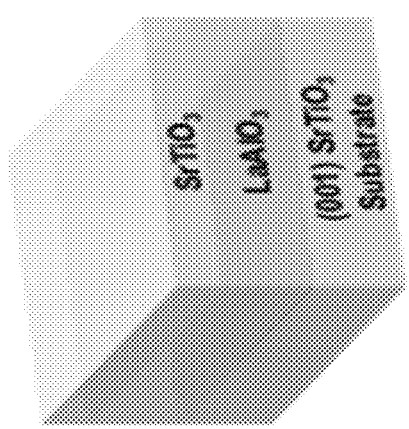
Figure 10C:
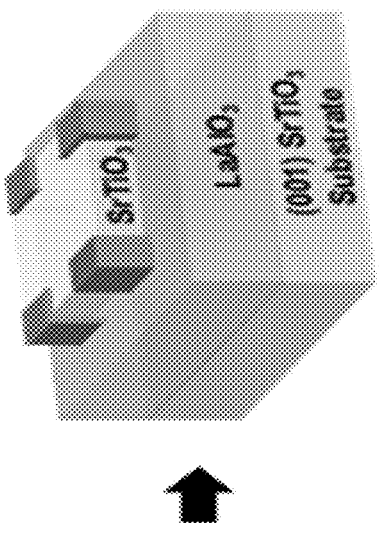
Figure 10E:
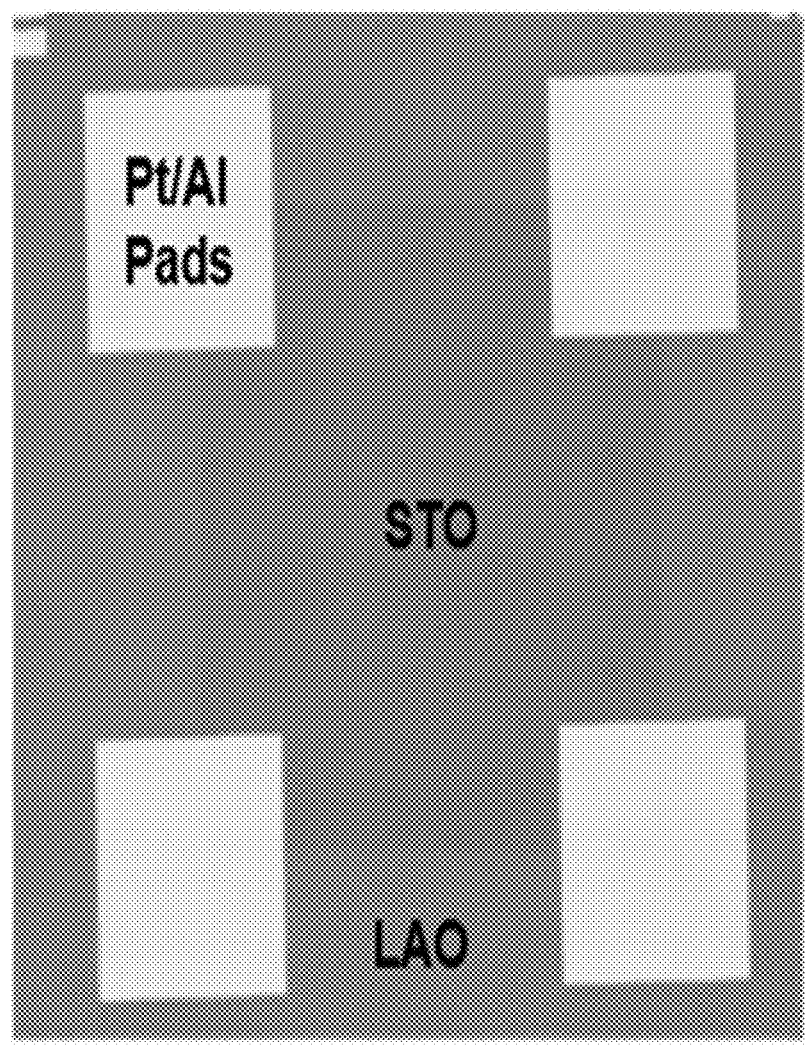
Figure 10F:
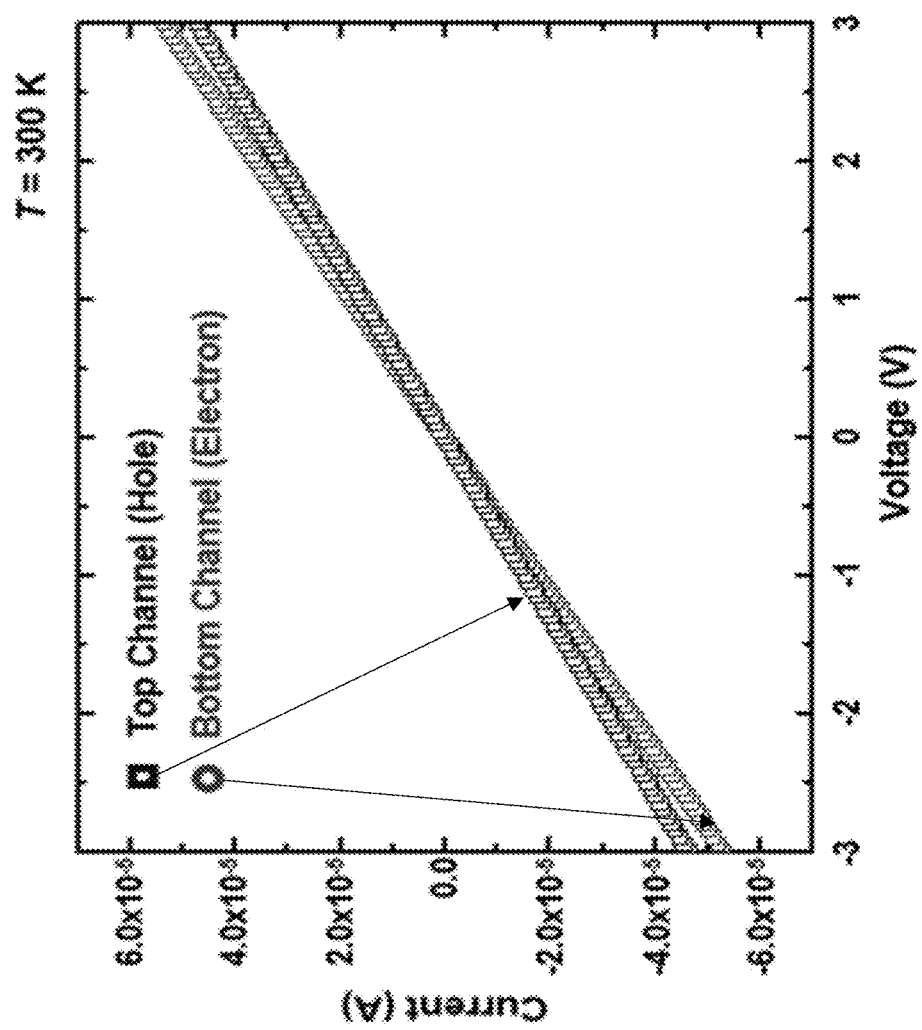
Figure 10G:
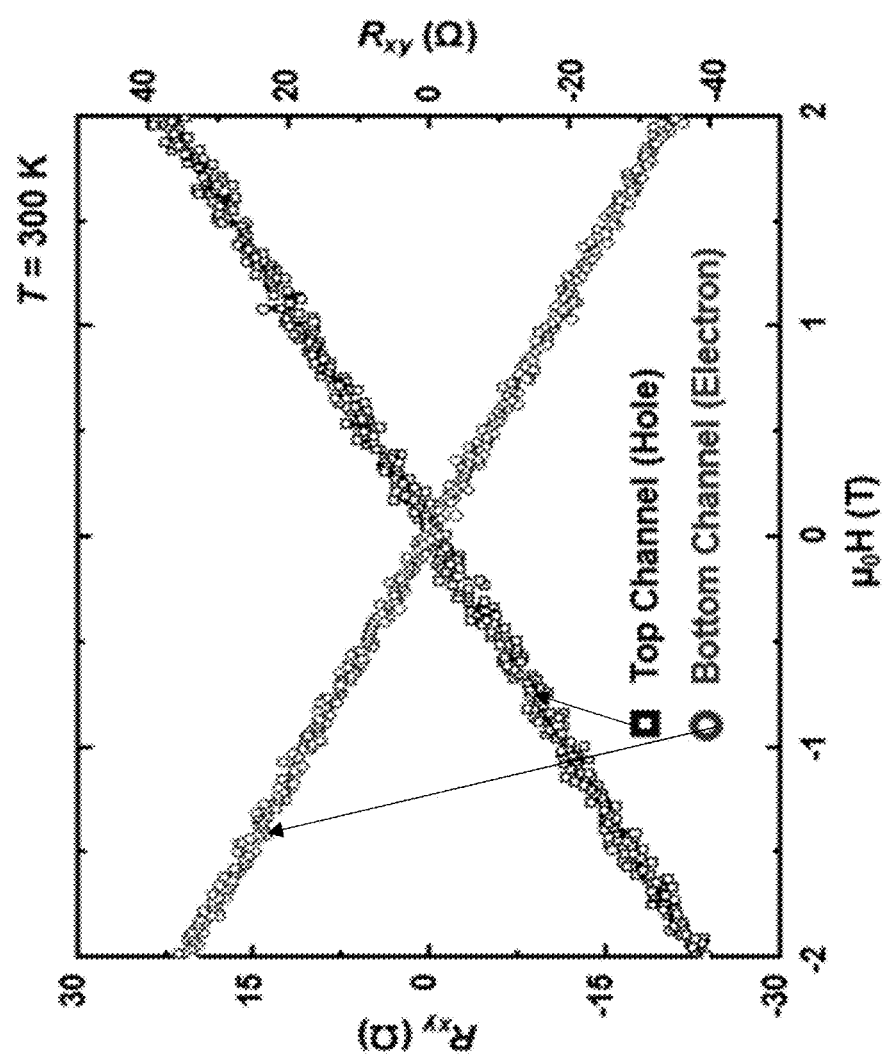
Figures 11A, 11B, 11C:
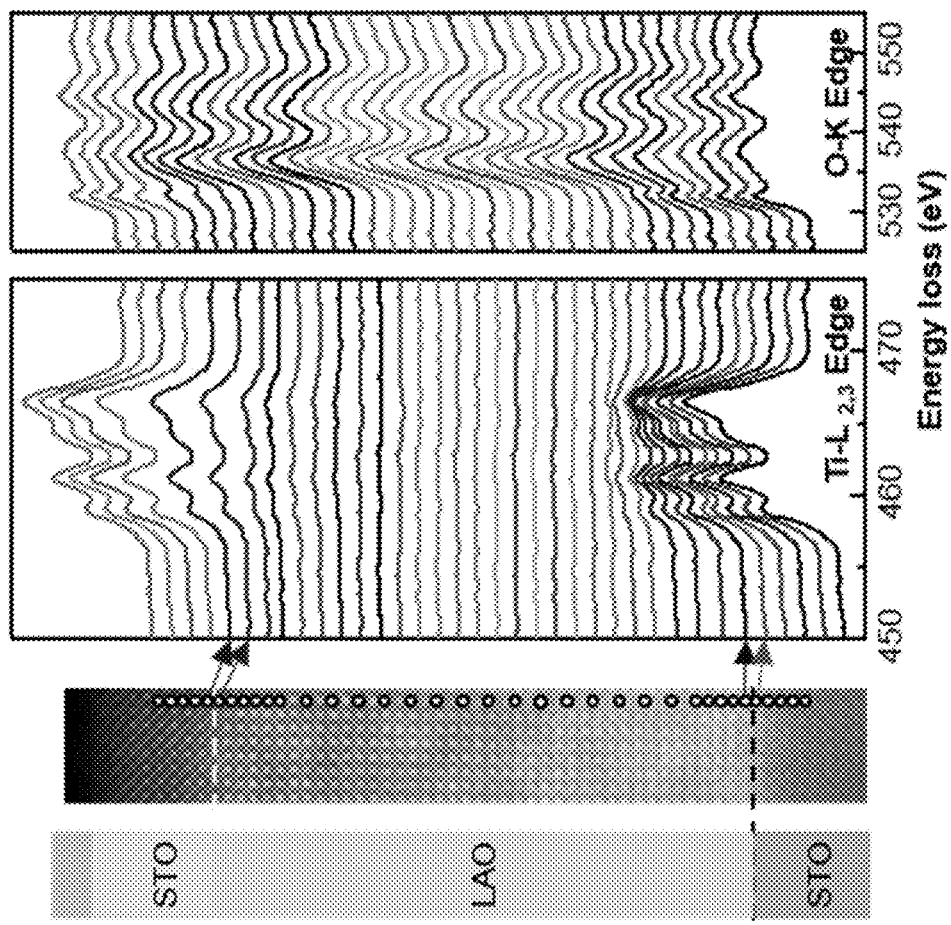
FIGS. 11A-11E depict electron energy-loss spectra (EELS) of STO/LAO/STO heterostructure.
Figure 11D:
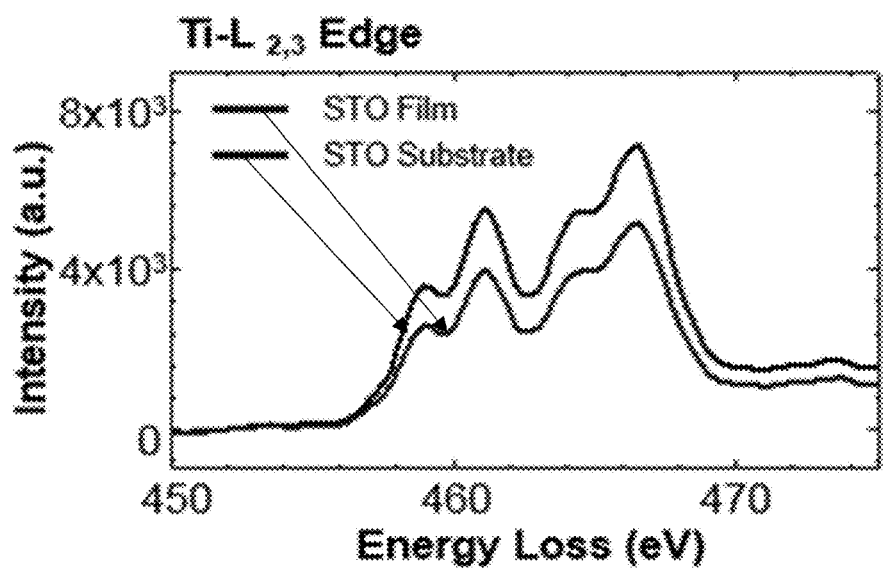
Figure 11E:
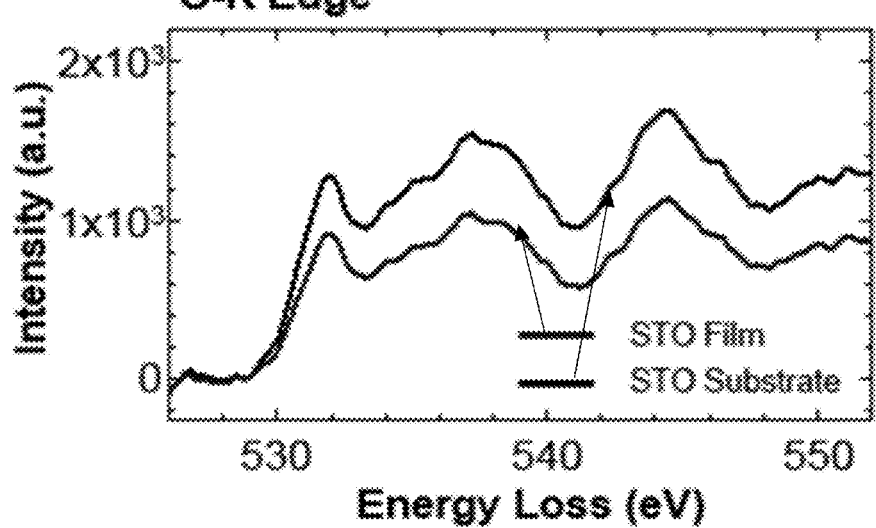

The electronic structure of the $LaO/TiO_2$ (n-type) and $AlO_2/SrO$ (p-type) interfaces were modelled using a supercell structure containing two n- and p-type interfaces symmetrically arranged at the opposite sides of the central STO layer. This allowed the elimination of otherwise spurious electric field occurring in STO due to the periodic boundary condition. The overall supercell was 2(STO)/SrO/5(LAO)/$TiO_2$/6(STO)/5(LAO)/3(STO), where numerals represent the number of unit-cells, and contained 220 atoms (FIG. 7A shows a half of the supercell). For the defect structures containing oxygen vacancies, the in-plane size of the supercell was increased to $\sqrt{2}\times\sqrt{2}$ of the cubic perovskite unit-cell. The modeling was performed using density functional theory (DFT) within the projected augmented wave (PAW) method for the electron-ion potential and the local density approximation (LDA) for exchange and correlation, as implemented in the Vienna ab initio simulation package (VASP). (See, Blochl, P. E., Projector Augmented-Wave Method. *Phys Rev B* 50, 17953-17979 (1994); Kresse, G., et al., Efficient iterative schemes for ab initio total-energy calculations using a plane-wave basis set. *Phys Rev B* 54, 11169-11186 (1996); Kresse, G., et al., From ultrasoft pseudopotentials to the projector augmented-wave method. *Phys Rev B* 59, 1758-1775 (1999).) The calculations were carried out using a kinetic energy cutoff of 340 eV and an 8×8×1 k-point mesh for Brillouin zone integration for a defect-free structure and a 6×6×1 k-point mesh for structures with oxygen vacancies. The ionic coordinates were fully relaxed with a force convergence limit of 0.01 eV/atom. The in-plane lattice constant was constrained to that of the LDA calculated lattice constant of STO ($\alpha$=0.386 nm).

STEM-EELS and EDS Measurements.

For STEM measurements, the samples were prepared using a standard lift-out method on a focused ion beam (FIB, JEOL JIB-4601F) to a thickness of around 100 µm. Sample thickness was further reduced to a regime where the atomic-scale STEM imaging is possible by Nanomill (Model 1040, Fischione). Surface damage induced by FIB was removed while varying the ion beam energies in the range of 500-900 eV in Nanomill system. HAADF STEM images were obtained on a JEM-ARM200F microscope (Jeol Ltd., Tokyo, Japan) equipped with a spherical aberration corrector (ASCOR) operating at 200 kV accelerating voltage. The probe convergence angle of approximately 22 mrad was used. The inner and outer angles of the HAADF detectors were 90 and 200 mrad, respectively. The obtained HAADF STEM images were deconvoluted with a simulated probe function (DeConv HAADF software, HREM Research Inc., Japan) to obtain good signal-to-noise data. EEL spectra and spectrum images were obtained at 200 kV using an EEL spectrometer (Gatan GIF Quantum ER, USA) with an energy resolution of 0.8 eV. HAADF STEM imaging mode combined with an energy dispersive X-ray spectrometer (JED-EDS, JEOL) was used to obtain atomic resolution chemical mapping data. Fast atomic-scale EDS mapping data of the sample within several minutes was acquired by utilizing a dual-type EDS detector (the effective X-ray sensing area of a 100 $mm^2$ for each) with a large effective solid angle (~0.8 sr) and a highly focused electron probe (~1.1 Å). The resulting chemical maps were obtained by the multiple frame summation up to less than 500 frames with the 256×256 pixel resolution and an acquisition time of 10 µsec per pixel (~5.5 min in maximum as a total acquisition time). The background noise floor in each map was removed using a Wiener filtering process.

Synchrotron Crystal Truncation Rod and Coherent Bragg Rod Analysis.

To precisely determine the full atomic structure of STO (10 unit-cells)/$LaAlO_3$ (40 unit-cells) thin films epitaxially-grown on a (001) STO substrate, we performed X-ray crystal truncation rod (CTR) measurements, and analyzed the CTR data using a phase retrieval technique known as coherent Bragg rod analysis (COBRA). The COBRA method applies an iterative process of alternatively satisfying constraints in real and reciprocal space to reconstruct the diffraction phases from measured diffraction intensities. (See, Zhou, H. et al. Anomalous expansion of the copper-apical-oxygen distance in superconducting cuprate bilayers. *P Natl Acad Sci USA* 107, 8103-8107 (2010).) The CTR measurements were conducted on a six-circle diffractometer using an X-ray energy of 20 keV at sector 12-ID-D of the Advanced Photon Source, Argonne National Laboratory. The X-ray beam at the beamline had a total flux of $4.0\times10^{12}$ photons/s and was vertically focused by a beryllium compound refractive lenses down to a beam profile of ~20 µm. The 2D-scattering images of CTRs at each step in the reciprocal lattices were recorded with a pixel array area detector (Dectris PILATUS-1 mm Si 100 K). A large group of symmetry-inequivalent CTRs were recorded with $L_{max}$=4.5 reciprocal lattice units (r.l.u.) for (001) pseudo-cubic system. The data acquisition sampling density was 400 points per r.l.u., sufficient to oversample the pronounced Laue-fringes along each CTR. Overall, more than 15,000 structural factor amplitudes were collected during this measurement. The generic approach based on refining a parameterized model (for example, model-dependent nonlinear least squares fitting) is not applicable to COBRA results for uncertainty estimation. Instead, a method called noise analysis was adopted to estimate the error bars of the parameters of interest. (See, Zhou, H., Pindak, R., Clarke, R., Steinberg, D. M. & Yacoby, Y. The limits of ultrahigh-resolution x-ray mapping: estimating uncertainties in thin-film and interface structures determined by phase retrieval methods. *J Phys D Appl Phys* 45 (2012).)

In-Line Electron Holography Measurement and Analyses.

In-line electron holography was carried out using a field-emission TEM (Libra 200 MC, Carl ZEISS) operated at 200 kV equipped with a monochromator (CEOS, Germany) and in-column type energy filter. An objective aperture of 10 µm in diameter was used to select the transmitted beam, which limits the spatial resolution to 0.8 nm. Bright-field (BF) TEM images at defocus values ranging from −7 µm to +7 µm were acquired in 1 µm step by exposing a 2048×2048 pixels fiber-optically coupled camera (UltraScan 1000 XP, Gatan, Inc.) for 4 s. All images were recorded using the corrected OMEGA in-column energy filter to remove inelastically-scattered electrons outside an energy window of 0±5 eV. In order to minimize electron beam damage and also to secure a large field of view, the BF TEM images were obtained at a low magnification (×31,500) under low electron dose conditions. The obtained in-line electron holograms were used to reconstruct the phase shift of the transmitted beam using the full resolution wave reconstruction (FRWR) algorithm. (See, Koch, C. T., Towards full-resolution inline electron holography. *Micron* 63, 69-75 (2014).) Then, the reconstructed phase data were converted to the map of the projected electrostatic potential by the linear equation. Subsequently, the charge density map was obtained from the potential data using Poisson's equation. In this process, the electric field-dependency of dielectric constant was taken into account. (See, Janolin, P. E., Strain on ferroelectric thin films. *J Mater Sci* 44, 5025-5048 (2009).) However, the charge density values might be overestimated due to the inaccuracy in determining the thin film dielectric constants.

Depth-Resolved Cathodoluminescence Spectroscopy Measurement and Analyses.

Depth-resolved cathodoluminescence spectroscopy (DR-CLS) was performed using a Physical Electronics Inc. (PHI) 110-10 glancing incidence election gun operated with beam voltages from 0.5 kV to 4.5 kV and an emission current controlled to provide a constant power of 1 mW with varying voltages under ultrahigh vacuum (UHV) conditions. The emitted photons were collected by a $CaF_2$ lens in vacuum, passed through a sapphire window port of the UHV chamber into an Oriel F-number matcher. The collected light was then dispersed through an Oriel MS260i monochromator using a grating with a 300 nm blaze into an Andor iDus OE charge coupled detector (CCD). The sample was coated with a 10-nm-thick gold overlayer and a grounded copper grid above it to minimize charging due to the incident electron beam. The oxygen vacancy index shown in FIG. 6B is defined as the intensity ratio between the CLS peak at 2.9 eV and the peak at 3.6 eV. The CLS peaks at 2.9 eV and at 3.6 eV represent the oxygen vacancy-related transition and the band gap transition of STO, respectively.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An oxide heterostructure comprising:
   a base layer comprising $SrTiO_3$;
   a polar layer comprising $LaAlO_3$ on the base layer;
   a non-polar layer comprising $SrTiO_3$ on the polar layer, the $SrTiO_3$ of the non-polar layer having a lower oxygen vacancy concentration than the $SrTiO_3$ of the base layer,
   a two-dimensional electron gas confined at an interface between the base layer and the polar layer; and
   a two-dimensional hole gas confined at an interface between the polar layer and the non-polar layer, wherein the two-dimensional hole gas has a Hall hole mobility that is at least as high as the Hall electron mobility of the two-dimensional electron gas at a temperature in the range from 1 K to 50 K.

2. The heterostructure of claim 1, wherein the $SrTiO_3$ of the non-polar layer has an oxygen vacancy index of no greater than 2.

3. An oxide heterostructure comprising:
   a base layer comprising $SrTiO_3$;
   a polar layer comprising $LaAlO_3$ on the base layer;
   a non-polar layer comprising $SrTiO_3$ on the polar layer, the $SrTiO_3$ of the non-polar layer having a lower oxygen vacancy concentration than the $SrTiO_3$ of the base layer,
   a two-dimensional electron gas confined at an interface between the base layer and the polar layer; and
   a two-dimensional hole gas confined at an interface between the polar layer and the non-polar layer, wherein the two-dimensional hole gas has a Hall hole mobility of at least $4\times10^2$ $cm^2V^{-1}s^{-1}$ at a temperature of 20 K.

4. The heterostructure of claim 1, wherein the polar layer has a thickness of at least 5 unit cells.

5. The heterostructure of claim 2, wherein the polar layer has a thickness of at least 5 unit cells.

6. A transistor comprising:
   the oxide heterostructure of claim 1;
   a source electrode;
   a drain electrode, wherein the source electrode and the drain electrode are in electrical communication through either the 2DEG or the 2DHG; and
   a gate electrode that is configured to alter the current flowing between the source electrode and the gate electrode when a gate voltage is applied to the gate electrode.

7. The heterostructure of claim 1, wherein the polar layer has a thickness of at least 4 unit cells.

8. The heterostructure of claim 3, wherein the two-dimensional hole gas has a Hall hole mobility of at least $5\times10^2$ $cm^2V^{-1}s^{-1}$ s at a temperature in the range from 1 K to 10 K.

9. The heterostructure of claim 3, wherein the $SrTiO_3$ of the non-polar layer has an oxygen vacancy index of no greater than 2.

10. The heterostructure of claim 3, wherein the polar layer has a thickness of at least 5 unit cells.

11. The heterostructure of claim 10, wherein the polar layer has a thickness of at least 5 unit cells.

* * * * *

UNITED STATES PATENT AND TRADEMARK OFFICE
CERTIFICATE OF CORRECTION

PATENT NO. : 10,580,872 B2
APPLICATION NO. : 15/596505
DATED : March 3, 2020
INVENTOR(S) : Chang-Beom Eom et al.

It is certified that error appears in the above-identified patent and that said Letters Patent is hereby corrected as shown below:

On the Title Page

IN THE ABSTRACT:
Line 5:
Delete the phrase "The oxide heterostructure includes a base layer of $SrTiO_3$, a polar layer of $LaAlO_2$, and a non-polar layer of $SrTiO_3$." and replace with --The oxide heterostructure includes a base layer of $SrTiO_3$, a polar layer of $LaAlO_3$, and a non-polar layer of $SrTiO_3$.--.

In the Specification

Column 2, Lines 45-46:
Delete the phrase "versus magnetic field µ0H the top and the bottom interface at 4 K." and replace with --versus magnetic field $\mu_0 H$ for the top and the bottom interface at 4 K.--.

Column 6, Line 11:
Delete the phrase "can be characterized by their Hall mobilities ($p_H$)," and replace with --can be characterized by their Hall mobilities ($\mu_H$),--.

Column 6, Lines 25-28:
Delete the phrase "Notably, in some embodiments of the oxide heterostructures the electrons of the 2DHG have a Hall mobility at 20 K of at least $4 \times 10^2$ $cm^2 V^{-1} s^{-1}$. This is includes embodiments of the oxide heterostructures" and replace with --Similarly, in some embodiments of the oxide heterostructures the electrons of the 2DEG have a Hall mobility at 20 K of at least $4 \times 10^2$ $cm^2 V^{-1} s^{-1}$. This includes embodiments of the oxide heterostructures--.

Column 8, Line 49:
Delete the phrase "their Hall mobility $\mu H$ (T) showed" and replace with --their Hall mobility $\mu_H$ (T) showed--.

Signed and Sealed this
Twenty-sixth Day of May, 2020

Andrei Iancu
*Director of the United States Patent and Trademark Office*